United States Patent
Badaroglu et al.

(10) Patent No.: US 10,332,881 B1
(45) Date of Patent: Jun. 25, 2019

(54) INTEGRATING A GATE-ALL-AROUND (GAA) FIELD-EFFECT TRANSISTOR(S) (FET(S)) AND A FINFET(S) ON A COMMON SUBSTRATE OF A SEMICONDUCTOR DIE

(71) Applicant: QUALCOMM Incorporated, San Diego, CA (US)

(72) Inventors: Mustafa Badaroglu, Kessel-Lo (BE); Kern Rim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/104,544

(22) Filed: Aug. 17, 2018

(51) Int. Cl.
| | |
|---|---|
| H01L 21/02 | (2006.01) |
| H01L 27/02 | (2006.01) |
| H01L 27/11 | (2006.01) |
| H01L 29/06 | (2006.01) |
| H01L 29/66 | (2006.01) |
| H01L 21/306 | (2006.01) |
| H01L 21/762 | (2006.01) |
| H01L 27/088 | (2006.01) |
| H01L 29/423 | (2006.01) |
| H01L 21/8234 | (2006.01) |

(52) U.S. Cl.
CPC .... *H01L 27/0886* (2013.01); *H01L 21/02381* (2013.01); *H01L 21/02532* (2013.01); *H01L 21/30625* (2013.01); *H01L 21/76224* (2013.01); *H01L 21/823412* (2013.01); *H01L 21/823418* (2013.01); *H01L 21/823431* (2013.01); *H01L 21/823437* (2013.01); *H01L 21/823481* (2013.01); *H01L 27/0207* (2013.01); *H01L 29/0649* (2013.01); *H01L 29/0673* (2013.01); *H01L 29/42392* (2013.01); *H01L 29/6656* (2013.01); *H01L 29/66545* (2013.01); *H01L 21/823475* (2013.01); *H01L 27/1104* (2013.01)

(58) Field of Classification Search
None
See application file for complete search history.

(56) References Cited

U.S. PATENT DOCUMENTS 8,563,376 B2  10/2013  Chang et al.
8,580,624 B2 * 11/2013  Bangsaruntip ......... B82Y 10/00
257/351

(Continued)

*Primary Examiner* — David E Graybill
(74) *Attorney, Agent, or Firm* — Withrow & Terranova, PLLC

(57) ABSTRACT

Integrating a gate-all-around (GAA) field-effect transistor(s) and a FinFET(s) on a common substrate of a semiconductor die is disclosed. GAA FETs and FinFETs can form integrated circuits (ICs). GAA FETs and FinFETs are integrated on a common substrate to optimize advantages of each type of FET. For example, FinFETs may be formed in the common substrate in the semiconductor die for forming circuits where reduced resistance and capacitance are important for performance, whereas GAA FETs may be formed in the common substrate in the semiconductor die for forming circuits with decreased threshold voltage to allow voltage scaling to lower supply voltages to reduce power consumption and also to reduce silicon area as a result of vertically stacked devices. This supports a designer having the freedom to separate control the channel width of the GAA FETs and FinFETs, which may be important for controlling drive strength and/or area for different circuits.

17 Claims, 32 Drawing Sheets

(56) References Cited

U.S. PATENT DOCUMENTS

| | | | |
|---|---|---|---|
| 8,809,957 B2* | 8/2014 | Bangsaruntip | B82Y 10/00 257/351 |
| 9,634,007 B2 | 4/2017 | Pillarisetty et al. | |
| 10,049,944 B2* | 8/2018 | Beasor | H01L 21/823821 |
| 2009/0289304 A1 | 11/2009 | Pouydebasque et al. | |
| 2013/0026451 A1* | 1/2013 | Bangsaruntip | H01L 29/66439 257/24 |
| 2013/0153997 A1* | 6/2013 | Chang | B82Y 10/00 257/334 |
| 2014/0027855 A1* | 1/2014 | Bangsaruntip | B82Y 10/00 257/351 |
| 2016/0111421 A1* | 4/2016 | Rodder | H01L 21/28123 257/401 |
| 2016/0190339 A1* | 6/2016 | Xie | H01L 29/66545 257/347 |
| 2016/0276484 A1 | 9/2016 | Kim et al. | |
| 2017/0162702 A1* | 6/2017 | Hu | H01L 29/78391 |
| 2018/0096899 A1 | 4/2018 | Beasor et al. | |
| 2018/0233570 A1* | 8/2018 | Hellings | H01L 21/82343 |

\* cited by examiner

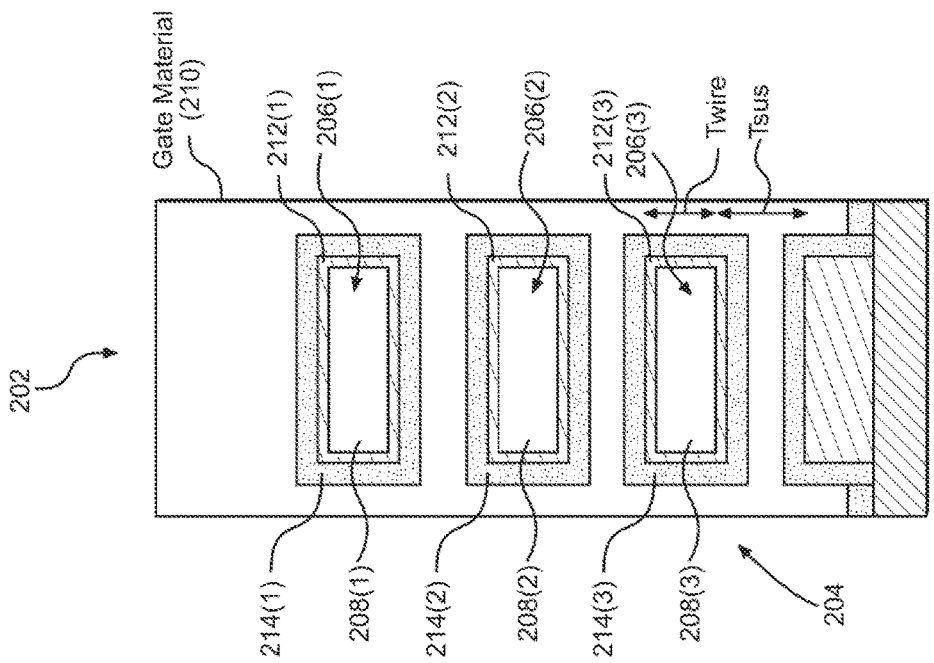
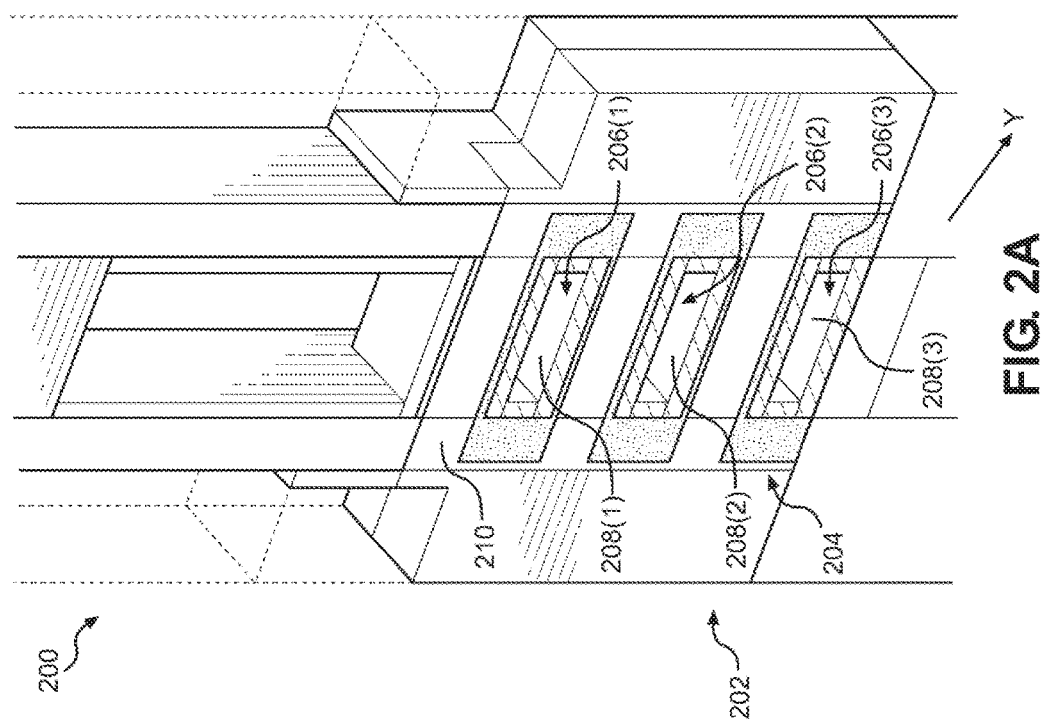
FIG. 2B
FIG. 2A

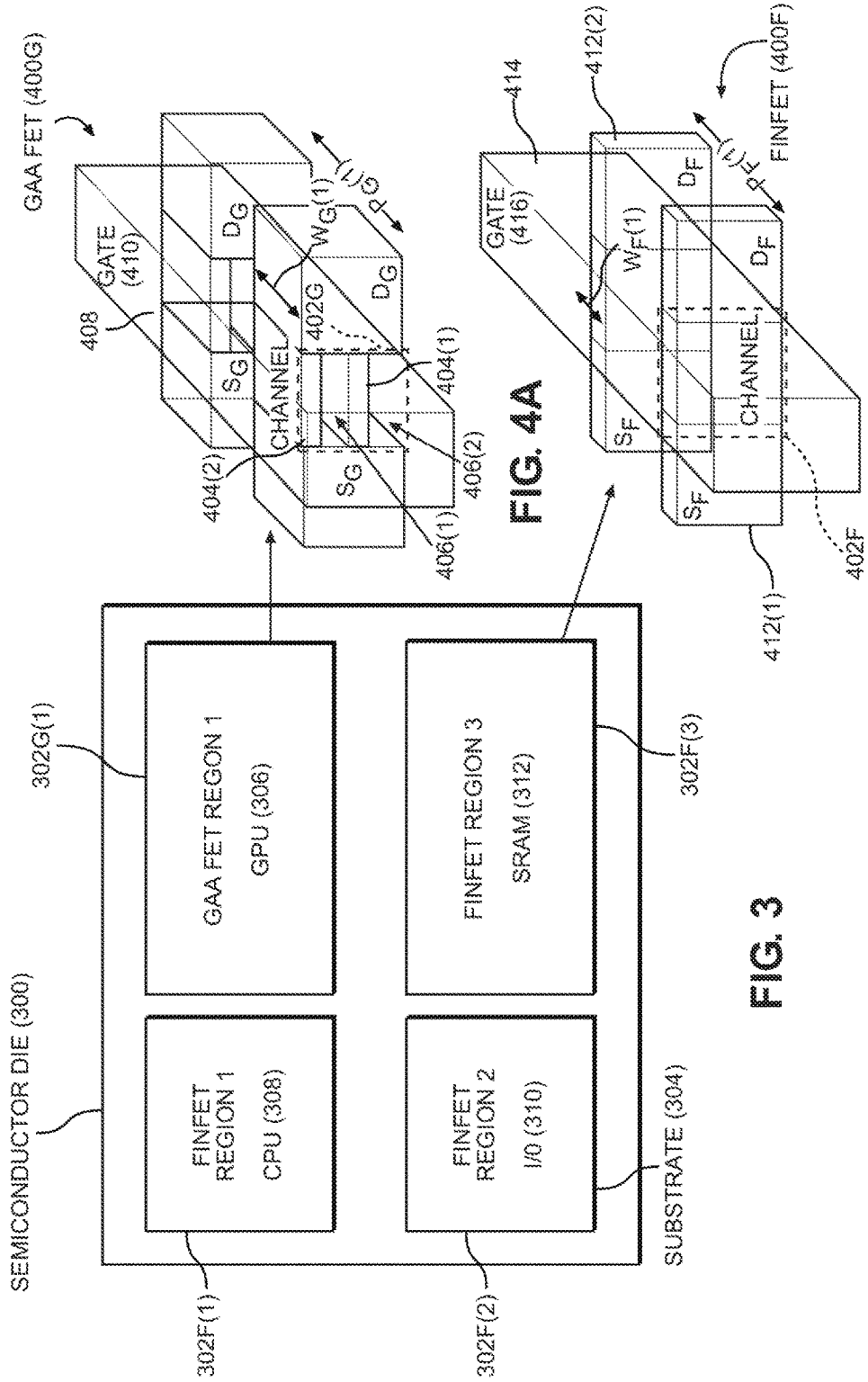

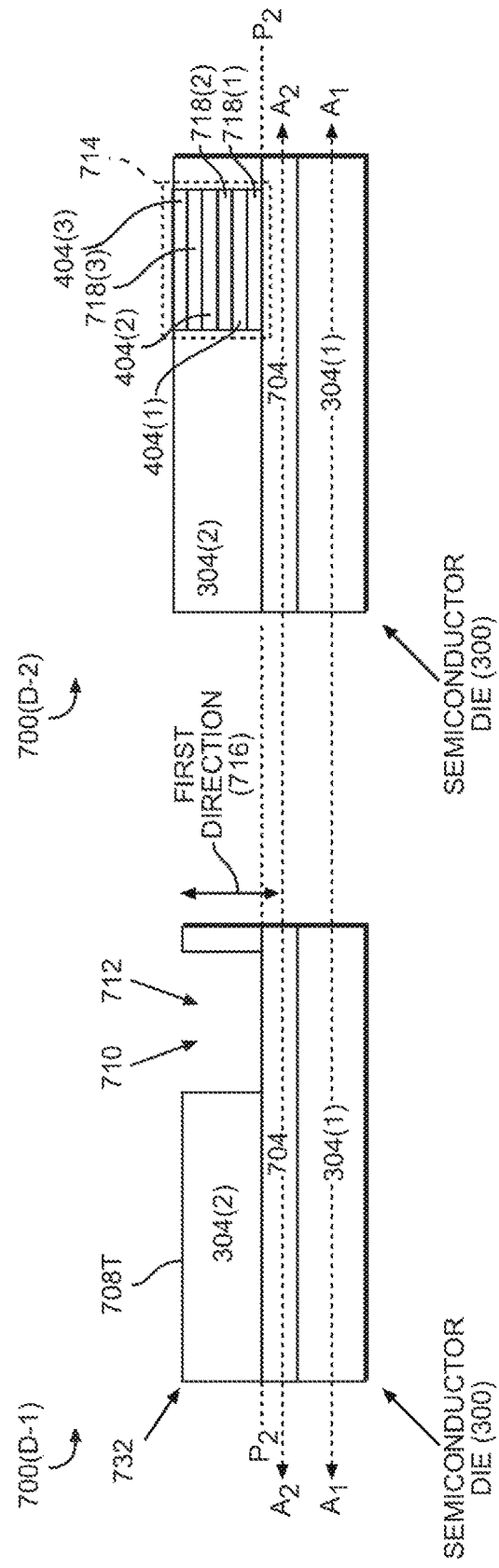

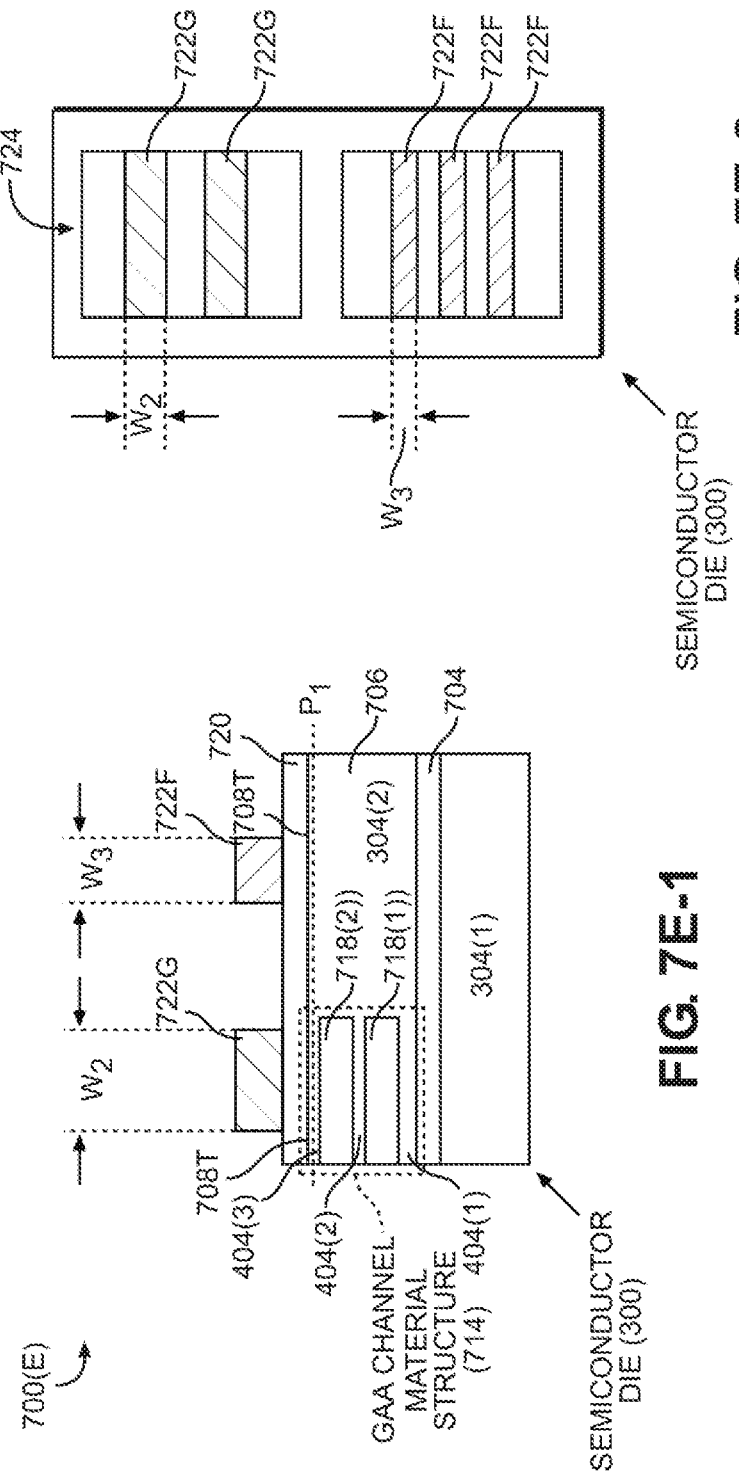

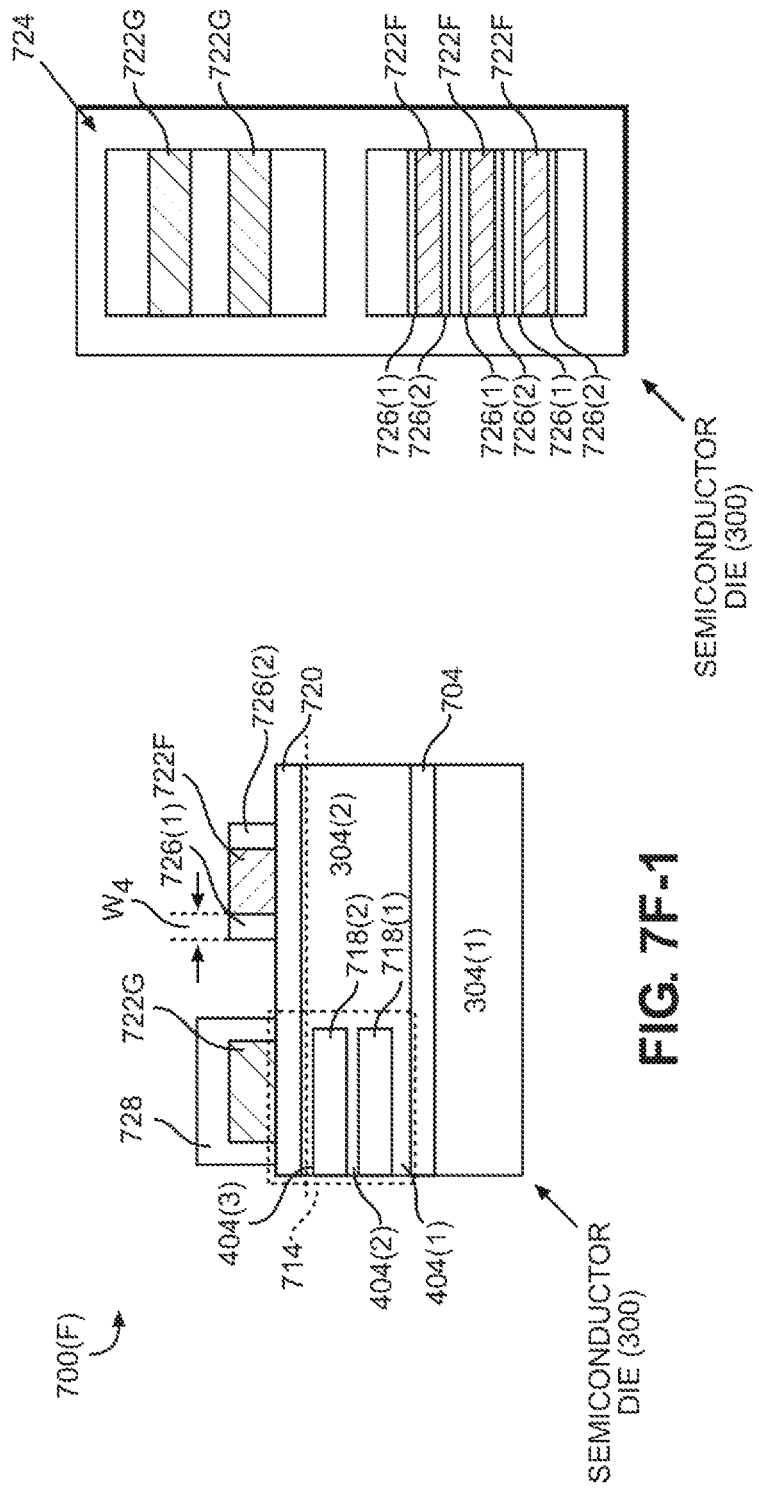

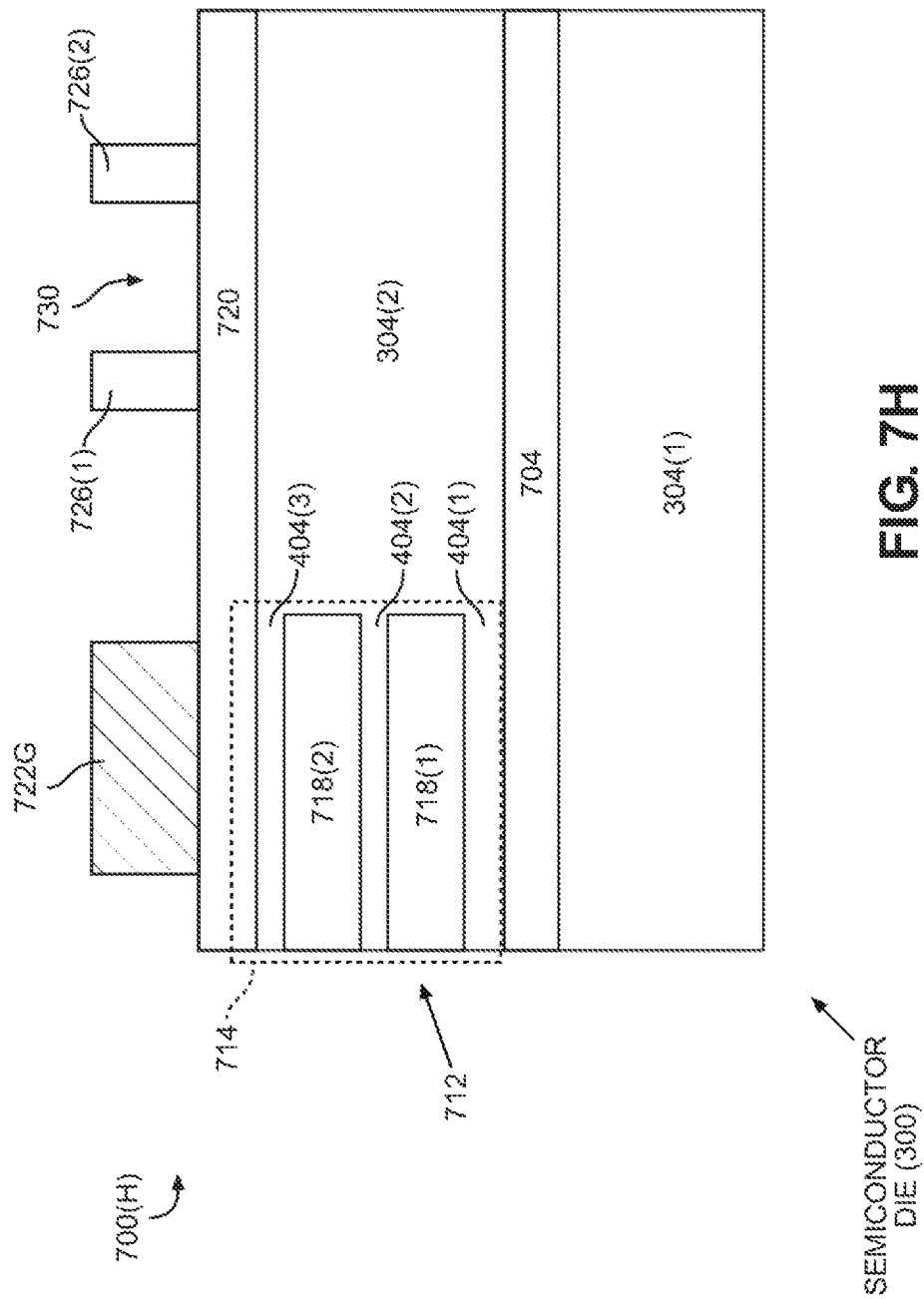

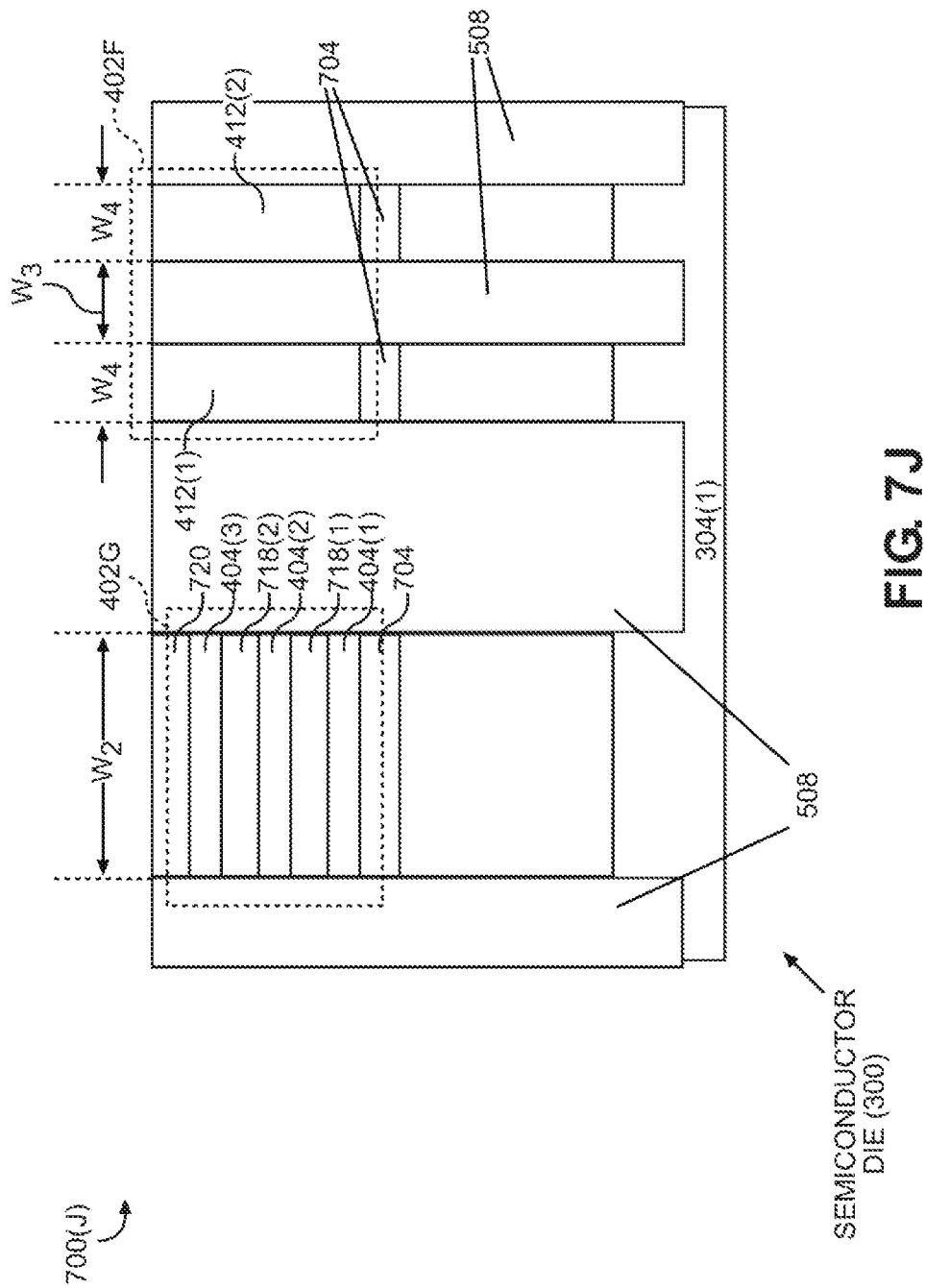

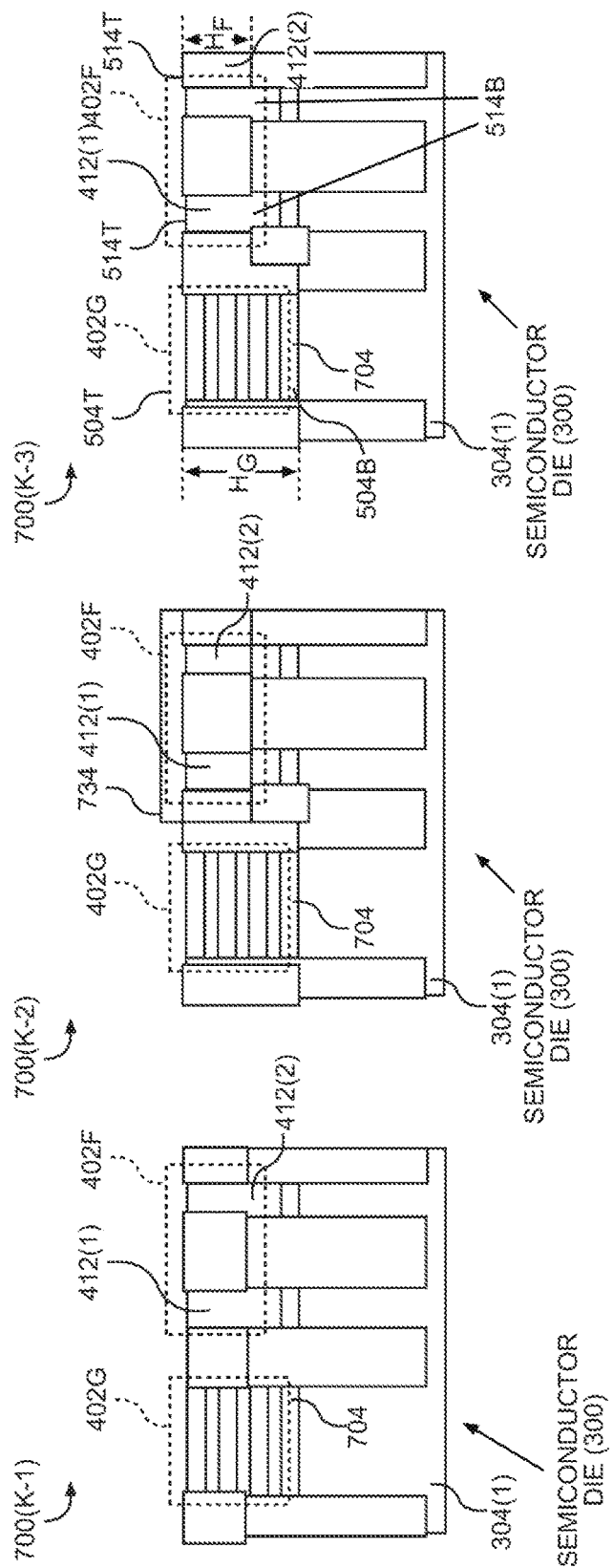

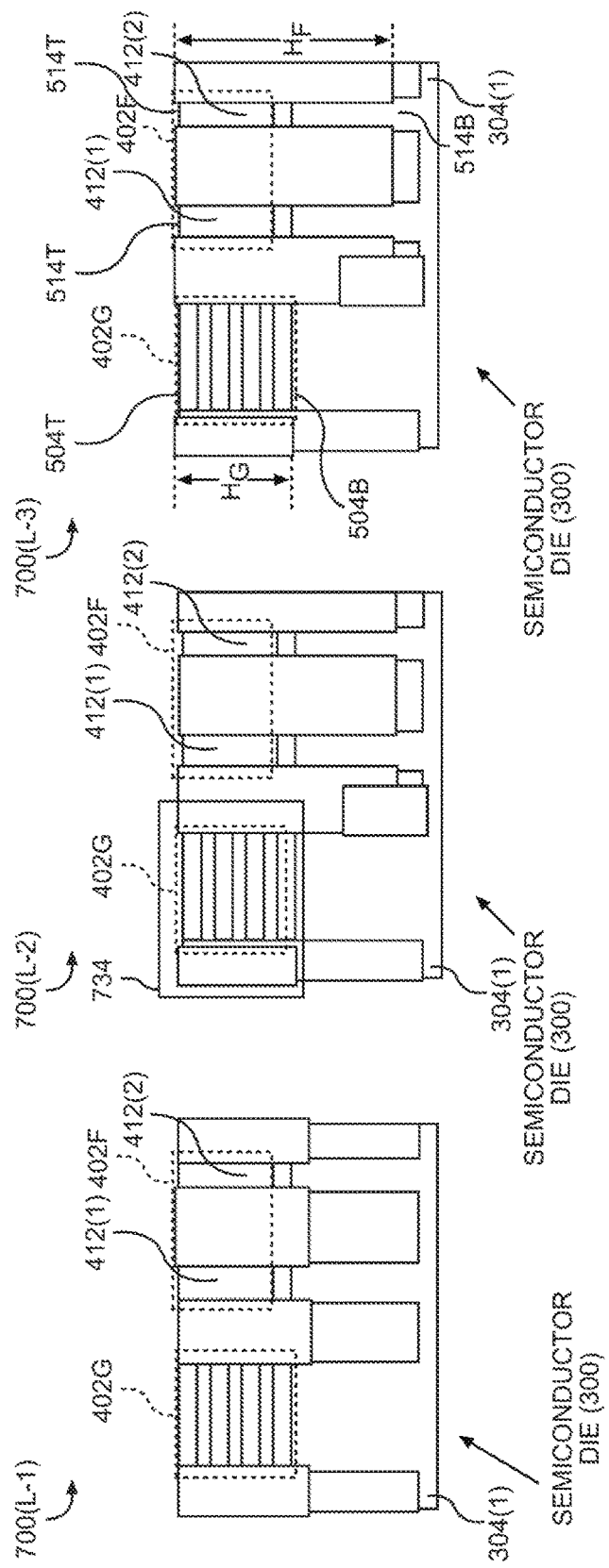

INTEGRATING A GATE-ALL-AROUND (GAA) FIELD-EFFECT TRANSISTOR(S) (FET(S)) AND A FINFET(S) ON A COMMON SUBSTRATE OF A SEMICONDUCTOR DIE

BACKGROUND

I. Field of the Disclosure

The technology of the disclosure relates generally to semiconductor devices forming integrated circuits (ICs), and more specifically, to gate around transistors, such as Fin Field-Effect Transistors (FETs) (FinFETs) and gate-all-around (GAA) transistors (e.g., nanowire, nanoslab, nanosheet transistors).

II. Background

Transistors are essential components in modern electronic devices. Large numbers of transistors are employed in integrated circuits (ICs) in many modern electronic devices. For example, components such as central processing units (CPUs), graphics processing units (GPUs), and memory systems each employ a large quantity of transistors for logic circuits and memory devices.

As electronic devices become more complex in functionality, so does the need to include a greater number of transistors in such devices. But as electronic devices are required to be provided in increasingly smaller packages, such as in mobile devices for example, there is need to provide a greater number of transistors in a smaller IC chip. This increase in the number of transistors is achieved in part through continued efforts to miniaturize transistors in ICs (i.e., placing increasingly more transistors into the same amount of space). In particular, node sizes in ICs are being scaled down by a reduction in minimum metal line width in the ICs (e.g., 65 nanometers (nm), 45 nm, 28 nm, 20 nm, etc.). As a result, the gate lengths of planar transistors are also scalably reduced, thereby reducing the channel length of the transistors and interconnects. Reduced channel length in planar transistors has the benefit of increasing drive strength (i.e., increased drain current) with smaller parasitic capacitances resulting in reduced circuit delay. However, as channel length in planar transistors is reduced such that the channel length is of the same order of magnitude as the depletion layers widths, short channel effects (SCEs) can occur that degrade performance. More specifically, SCEs in planar transistors can cause increased current leakage, reduced threshold voltage, and/or threshold voltage roll-off (i.e., reduced threshold voltage at shorter gate lengths).

In this regard, to address the need to scale down channel lengths in transistors while avoiding or mitigating the effect of SCEs, alternative transistor designs to planar transistors have been developed. For example, a Fin field-effect transistor (FET) (FinFET) has been developed that provides a conducting channel wrapped by a thin silicon "fin," which forms the gate of the device. In this regard, FIG. 1A illustrates an exemplary FinFET 100. The FinFET 100 includes a body 102 (e.g., an oxide layer) The FinFET 100 includes a source 104 and a drain 106 interconnected by a Fin 108 that includes a conduction channel 110 ("channel 110"), as shown in FIG. 1B. The Fin 108 is surrounded by a "wrap-around" metal gate 112 ("gate 112"). FIG. 1B illustrates a close-up cross-sectional side view of the FinFET 100 in FIG. 1A along an A-A line. As shown in FIG. 1B, an interfacial layer 114 and a dielectric material layer 116 are disposed around the channel 110 to insulate the gate 112 from the channel 110. The wrap-around structure of the gate 112 around the channel 110 provides better electrical control over the channel 110, and thus assists in reducing the leakage current and overcoming other SCEs. The thickness DFin of the Fin 108 (measured in the direction from the source 104 to the drain 106) determines the effective channel length of the FinFET 100.

FIGS. 2A and 2B illustrate perspective and side views, respectively, of an exemplary nanowire FET 200 that is a gate-all-around (GAA) device. As shown in FIG. 2A, the nanowire FET 200 includes a channel body 202 that includes a nanowire channel structure 204 that includes a plurality of nanowire structures 206(1)-206(3) that form a channel. In this example, the nanowire structures 206(1)-206(3) are in the form of nanoslabs 208(1)-208(3). FIG. 2B illustrates a side view of the channel body 202 in the nanowire FET 200 in FIG. 2A. As shown in FIGS. 2A and 2B, a gate material 210 in the form of a metal material completely surrounds the nanowire structures 206(1)-206(3). Before the gate material 210 is disposed, an interfacial layer 212(1)-212(3) is disposed around the respective nanowire structures 206(1)-206(3) followed by a high-K dielectric material layer 214(1)-214(3) to insulate the gate material 210 from the nanowire structures 206(1)-206(3). In this manner, applying a voltage to the gate material 210 controls an electric field in the nanowire structures 206(1)-206(3) to cause current to flow through the nanowire structures 206(1)-206(3) during an active mode. The length of the nanowire structures 206(1)-206(3) is each of a height of Twire. The overall length and perimeter, respectively, of the nanowire structures 206(1)-206(3) determine the effective nanowire length in the channel body 202, and the drive strength of the nanowire FET 200. Drive strength of nanowire FETs is also determined the number of vertically stacked nanowires. Adjacent nanowire structures 206(1)-206(3) are separated a distance from each other labeled Tsus in FIG. 2A. This distance Tsus is provided of a distance based on fabrication limitations to allow the gate material 210 to be disposed completely around and between the adjacent nanowire structures 206(1)-206(3) so that the gate material 210 can provide gate control of the channels formed by the nanowire structures 206(1)-206(3) to control the channel of the nanowire FET 200.

There is continued pressure to improve the processing capabilities of ICs, which results in pressure to increase a number of transistors present on a given IC. This pressure, coupled with pressure from mobile device users, has resulted in reductions in the size of the transistors. For example, the node size for GAA FETs (i.e., the spacing between elements in the IC) has reached 10 nm, and in some cases 7 nm down to 3 nm. GAA FETs can be designed to have a lower threshold voltage than similar FinFET devices, because GAA FETs have better short channel control. This allows a reduction in supply voltage, which results in a quadratic reduction in power consumption because of voltage scaling. However, disadvantages of GAA FETs are increased resistance resulting in increased current-resistance (IR) drop and increased capacitance due to coupling between source/drain and gate. GAA FETs also suffer from an area penalty over FinFETs when more than one active semiconductor fin is employed for drive strength requirements. Thus, the performance advantages of GAA FETs versus FinFETs may diminish for high-performance blocks such as CPU cells, memory cells and input/output (I/O) cells. Frequency performance also decreases as resistance and capacitance increase.

SUMMARY OF THE DISCLOSURE

Aspects disclosed herein include integrating a gate-all-around (GAA) field-effect transistor(s) (FET(s)) and a Fin- FET(s) on a common substrate of a semiconductor die. Related methods are also disclosed. GAA FETs and FinFETs can be employed to form integrated circuits (ICs). In exemplary aspects disclosed herein, GAA FETs and FinFETs are integrated on a common substrate to optimize advantages of each type of FET for different circuit applications in a semiconductor die. Thus, FinFETs may be formed with the common substrate in the semiconductor die for forming circuits where reduced resistance and capacitance are important for performance, whereas GAA FETs may be formed with the common substrate in the semiconductor die for forming circuits with a decreased threshold voltage to allow voltage scaling to lower supply voltages to reduce power consumption, and also to reduce silicon area as a result of vertically stacked devices. For example, it may be more desirable to employ GAA FETs in a graphics processing unit (GPU) formed in a semiconductor die for decreased threshold voltage and reduced power consumption where frequency performance is not as critical. However, it may be more desirable to employ FinFETs for reduced resistance and capacitance in other circuits formed in the semiconductor die where frequency performance is more critical, such in a central processing unit (CPU). This supports a designer having the freedom to separately control the channel width of the GAA FETs and FinFETs, which may be important for controlling drive strength and/or area for different circuits. For example, FinFETs may require a channel width of less than 10 nanometers (nm) (e.g., 5-10 nm) where lithography processes are not effective, but spacer-based fin formation processes are, whereas GAA FETs may allow for a channel width greater than 10 nm (e.g., 12-30 nm) where lithography processes are effective.

In this regard, in one exemplary aspect, a semiconductor die is provided. The semiconductor die comprises a substrate comprising a semiconductor material, the substrate comprising a top surface and a bottom surface. The semiconductor die also comprises one or more gate-all-around (GAA) field-effect transistors (FETs). Each of the one or more GAA FETs comprise a GAA channel structure disposed on the substrate, comprising a plurality of nanostructures each comprising the semiconductor material and formed in a stacked arrangement on the substrate, a plurality of separation areas disposed between adjacent nanostructures among the plurality of nanostructures, and the GAA channel structure having a top surface disposed in a first plane above the top surface of the substrate. The one or more GAA FETs also each comprise a first gate material disposed in at least a portion of the plurality of separation areas between the adjacent nanostructures. The semiconductor die also comprises one or more FinFETs. The one or more FinFETs each comprise at least one Fin channel structure comprising the semiconductor material and disposed on the substrate, a second gate material disposed adjacent to at least a portion of a top surface, and a side of the at least one fin channel structure. The top surface of the at least one fin channel structure is disposed in the first plane.

In another exemplary aspect, a method of fabricating one or more fin field-effect transistor (FETs) FinFETs and one or more GAA FETs integrated on a common substrate of a semiconductor die is provided. The method comprises forming a first substrate disposed in a first longitudinal axis and comprising a semiconductor material. The method also comprises forming an etch stop layer on the first substrate. The method also comprises forming a second substrate disposed in a second longitudinal axis parallel to the first longitudinal axis and comprising the semiconductor material on the etch stop layer, the second substrate comprising a top surface and a bottom surface, wherein a first portion of the second substrate comprises a fin channel material. The method also comprises selectively form one or more recesses in a second portion of the second substrate from the top surface of the second substrate to the etch stop layer in a first direction orthogonal to the second longitudinal axis. The method also comprises forming a GAA channel material structure in each recess among the one or more recesses. The method also comprises removing the GAA channel material structure in the second portion of the second substrate and the first substrate below the second portion of the second substrate outside of the one or more recesses to form one or more GAA channel structures having a first top surface disposed in a first plane above the top surface of the first substrate. The method also comprises removing the fin channel material in the first portion of the second substrate and the first substrate below the first portion of the second substrate to form one or more fin channel structures from the second substrate. The one or more fin channel structures have a second top surface disposed in the first plane.

BRIEF DESCRIPTION OF THE FIGURES

FIGS. 2A and 2B illustrate an exemplary nanowire FET;

FIG. 3 is a top view of an exemplary semiconductor die that includes integrated circuits (ICs) that includes gate-all-around (GAA) FET regions that include gate-all-around (GAA) FETs and FinFET regions of the semiconductor die include FinFETs, where the GAA FETs and FinFETs are integrated on a common substrate in the semiconductor die;

FIG. 4A is a perspective view of an exemplary GAA FET that can be employed in a GAA FET region of the semiconductor die in FIG. 3;

FIG. 4B is a perspective view of an exemplary FinFET that can be employed in a FinFET region of the semiconductor die in FIG. 3;

FIGS. 7D-1 and 7D-2 illustrate other exemplary fabrication stages showing forming a recess in the semiconductor channel material layer in the fabrication stage of the semiconductor die in FIG. 7C and forming heterogeneous layers in the recess, as part of a process of fabricating a semiconductor channel structure ("channel structure") for a GAA FET integrated with a FinFET on a common substrate of a semiconductor die;

FIGS. 7E-1 and 7E-2 illustrate side and top views, respectively, of another exemplary fabrication stage of forming a hard mask layer and respective mandrels above GAA FET and FinFET channel structures using a lithography process, as part of a single-step mandrel transfer process as part of a process of fabricating a channel structure for a GAA FET integrated with a FinFET on a common substrate of a semiconductor die;

FIGS. 7F-1 and 7F-2 illustrate side and top views, respectively, of another exemplary fabrication stage of forming a hard mask over the mandrel formed over the GAA channel structure and forming spacers on sides of the mandrel formed over the FinFET channel structure in the fabrication stage of the semiconductor die in FIGS. 7E-1 and 7E-2, as part of a process of fabricating a channel structure for a GAA FET integrated with the FinFET on a common substrate of a semiconductor die;

FIG. 7H illustrates a side view of another exemplary fabrication stage of removing the hard mask formed above the mandrel formed above the GAA channel structure in the fabrication stage of the semiconductor die in FIG. 7G, as part of a process of fabricating a FinFET and a GAA FET integrated on a common substrate of a semiconductor die;

FIG. 7J illustrates a side view of another exemplary fabrication stage after removing the hard mask layer and the spacers in the outside of the mandrel formed above the GAA FET and FinFET channel structures and filling the exposed channels adjacent to the GAA FET and FinFET channel structures with dielectric material to provide shallow trench isolation (STI), as part of a process of fabricating a FinFET and a GAA FET integrated on a common substrate of a semiconductor die;

FIGS. 7K-1-7K-3 illustrate side views of additional exemplary fabrication stages for recess of the STI after the fabrication stage in FIG. 7J, as part of a process of fabricating a FinFET and a GAA FET integrated on a common substrate of a semiconductor die;

FIG. 7L-1-7L-3 illustrate a side view of alternative fabrication stages for recess of the shallow trench isolation (STI) after the fabrication stage in FIG. 7J, as part of a process of fabricating a FinFET and GAA FET integrated on a common substrate of a semiconductor die;

DETAILED DESCRIPTION

Figure 1B:
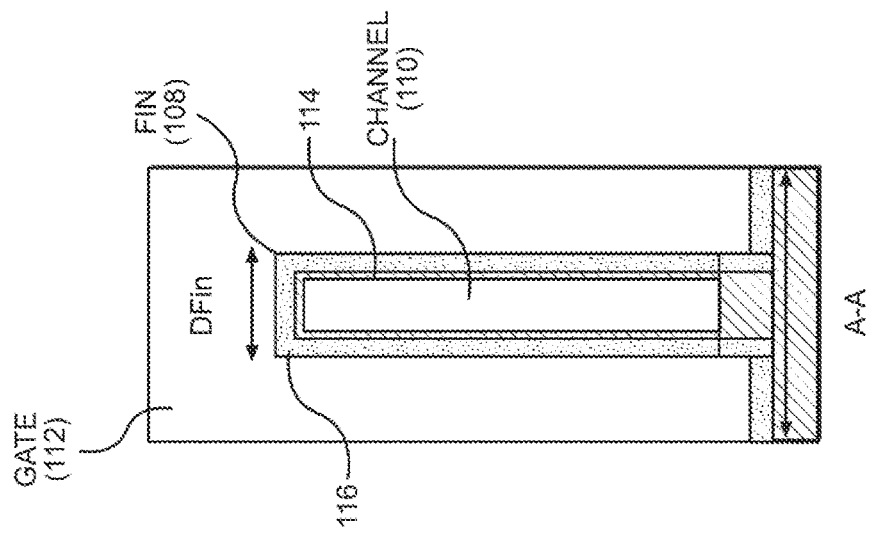
FIG. 1B is a close-up cross-sectional side view of the fin in the FinFET in FIG. 1A along the A-A line.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include integrating a gate-all-around (GAA) field-effect transistor(s) (FET(s)) and a FinFET(s) on a common substrate of a semiconductor die. Related methods are also disclosed. GAA FETs and FinFETs can be employed to form integrated circuits (ICs). In exemplary aspects disclosed herein, GAA FETs and FinFETs are integrated on a common substrate to optimize advantages of each type of FET for different circuit applications in a semiconductor die. Thus, FinFETs may be formed with the common substrate in the semiconductor die for forming circuits where reduced resistance and capacitance are important for performance, whereas GAA FETs may be formed with the common substrate in the semiconductor die for forming circuits with a decreased threshold voltage to allow voltage scaling to lower supply voltages to reduce power consumption and also to reduce silicon area as a result of vertically stacked devices. For example, it may be more desirable to employ GAA FETs in a graphics processing unit (GPU) formed in a semiconductor die for decreased threshold voltage and reduced power consumption where frequency performance is not as critical. However, it may be more desirable to employ FinFETs for reduced resistance and reduced capacitance in other circuits formed in the semiconductor die where frequency performance is more critical. This supports a designer having the freedom to separately control the channel width of the GAA FETs and to select FinFETs, which may be important for controlling drive strength and/or area for different circuits. For example, FinFETs may require a channel width of less than 10 nanometers (nm) (e.g., 5-10 nm) where lithography processes are not effective, but spacer-based fin formation processes are, whereas GAA FETs may allow for a channel width greater than 10 nm (e.g., 12-30 nm) where lithography processes are effective.

In this regard, FIG. 3 is a top view of an exemplary semiconductor die 300 that supports ICs that includes a GAA FET region 302G(1) that include GAA FETs and FinFET regions 302F(1)-302F(3) that include FinFETs co-integrated on a common substrate 304. For example, the GAA FET region 302G(1) may include a graphics processing unit (GPU) 306 that includes GAA FETs formed in the common substrate 304 of the semiconductor die 300 for decreased threshold voltage and reduced power consumption where frequency performance may not be critical. As another example, the FinFET regions 302F(1)-302F(3) may include a central processing unit (CPU) 308, input/output (I/O) devices 310, and a static random access memory (SRAM) 312 that include FinFETs formed in the common substrate 304 of the semiconductor die 300 where reduced resistance and reduced capacitance for increased frequency performance is important. In this manner, GAA FETs and FinFETs can be co-integrated on the same substrate 304 in the semiconductor die 300 without having to either exclude GAA FETs or FinFETs from the semiconductor die 300 or employ multiple semiconductor dies 300 and/or chips to provide ICs with the desired performances.

Examples of a GAA FET and a FinFET that can be included in the respective GAA FET region 302G(1) and the FinFET regions 302F(1)-302F(3) co-integrated on the common substrate 304 of the semiconductor die 300 to form ICs are shown in a GAA FET 400G and a FinFET 400F in FIGS. 4A and 4B, respectively. As shown in FIG. 4A, the GAA FET 400G includes a GAA channel structure 402G that includes nanostructures 404(1), 404(2) each comprising a semiconductor material and formed in a stacked arrangement. For example, the nanostructures 404(1), 404(2) may include nanowires, nanoslabs, or nanosheets. Separation areas 406(1), 406(2) are disposed between the adjacent nanostructures 404(1), 404(2). A gate material 408 is disposed over and around the nanostructures 404(1), 404(2) and in the separation areas 406(1), 406(2) to form a gate 410. A source $S_G$ and drain $D_G$ are formed on each side of the GAA channel structure 402G. The GAA channel structure 402G is formed of a desired width $W_{G(1)}$ which affects the drive strength of the GAA FET 400G. Adjacent GAA channel structures 402G are separated from each other by a channel pitch $P_{G(1)}$. As shown in FIG. 4B, the FinFET 400F includes a fin channel structure 402F that includes two fins 412(1), 412(2) each comprising a semiconductor material. A source $S_F$ and drain $D_F$ are formed in end regions of the fins 412(1). 412(2). A gate material 414 is disposed over and around the fins 412(1), 412(2) to form a gate 416. The fins 412(1), 412(2) of the fin channel structure 402F are each formed of a desired width $W_{F(1)}$ and separated from each other by a fin pitch $P_{F(1)}$. The fin pitch $P_{F(1)}$ may be greater or smaller than the channel pitch $P_{G(1)}$ depending on the design and performance requirements desired of the GAA FET 400G and the FinFET 400F and also process limitations.

Figure 5:
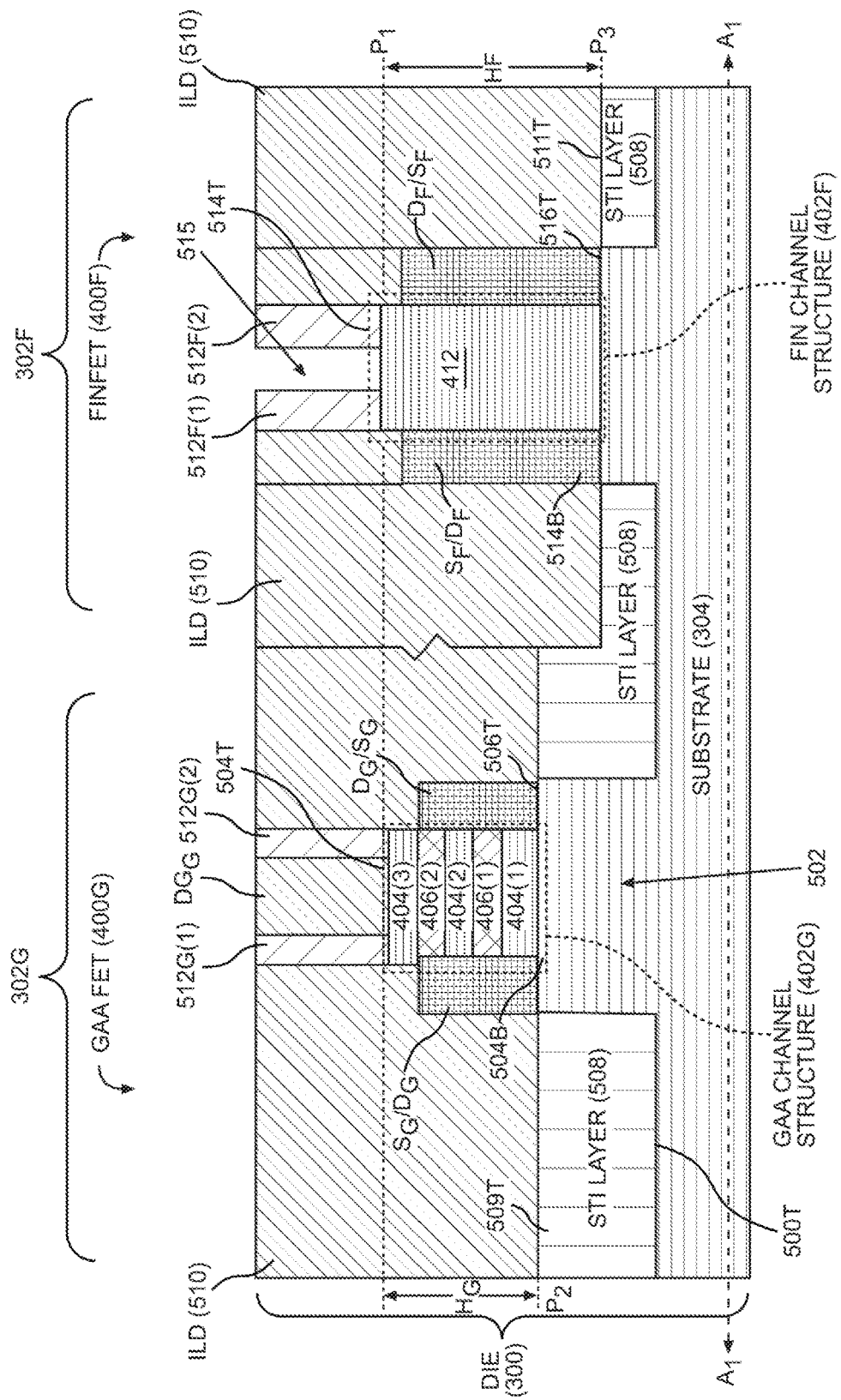
FIG. 5 is a side view of an exemplary GAA FET and FinFET integrated on a common substrate of the semiconductor die in FIG. 3.

FIG. 5 is a side view of the semiconductor die 300 in FIG. 3 illustrating additional exemplary detail of a GAA FET 400G and a FinFET 400F integrated on the common substrate 304. The GAA FET 400G in this example is shown after a fabrication stage having a sacrificial dummy gate $DG_G$ before the dummy gate $DG_G$ is removed and a metal gate material is formed. As shown in FIG. 5, a common substrate 304 is shown in which the GAA FET 400G and the FinFET 400F are integrated. The substrate 304 in this example is a semiconductor material. For example, the substrate 304 can be Silicon (Si). Note that the GAA FET 400G and the FinFET 400F are shown immediately adjacent to each other in FIG. 5, but also note that the GAA FET 400G and the FinFET 400F could be located in different regions of the semiconductor die 300 in a respective GAA FET region 302G and a FinFET region 302F. The GAA FET 400G includes the GAA channel structure 402G disposed on the substrate 304. The GAA channel structure 402G includes a plurality of nanostructures 404(1)-404(3) also of a semiconductor material and which are formed in a stacked arrangement on the substrate 304. The nanostructures 404(1)-404(3) are shown as nanoslabs in the GAA channel structure 402G of the GAA FET 400 in FIG. 5, but note that other types of nanostructures including nanowires and nanosheets could be employed. A plurality of separation areas 406(1)-406(2) is shown disposed between the adjacent nanostructures 404(1)-404(3). A gate material can be disposed in the separation areas 406(1)-406(2) to form a gate material around the nanostructures 404(1)-404(3) to form a gate for the GAA FET 400G.

As will be discussed in more detail below, the GAA channel structure 402G of the GAA FET 400G could be formed in the substrate 304 by etching out a recess in the substrate 304 and thereafter forming layers of the nanostructures 404(1)-404(3) and etch selective material, such as Silicon Germanium (SiGe) where the separation areas 406(1)-406(2) are located to form a heterogeneous structure. The substrate 304 can then be etched to form the GAA channel structure 402G down to a top surface 500T such that a portion 502 of the substrate 304 extends above the top surface 500T below the GAA channel structure 402G. The GAA channel structure 402G has a top surface 504T that is formed in a first plane $P_1$ above a top surface 506T of the substrate 304. The GAA channel structure 402G extending above a shallow trench isolation (STI) layer 508 of an electrical isolation material (e.g., a dielectric material) disposed on the substrate 304. The STI layer 508 defines a bottom surface 504B of the GAA channel structure 402G in a plane $P_2$ that defines an overall height $H_G$ of the GAA channel structure 402G. The selection of the materials for the nanostructures 404(1)-404(3) as well as the overall height $H_G$ of the GAA channel structure 402G are factors that affect the channel control and drive strength of the GAA FET 400G. A source/drain $S_G/D_G$ and a drain/source $D_G/S_G$ are formed on adjacent sides of the GAA channel structure 402G. For example, the source/drain $S_G/D_G$ and the drain/source $D_G/S_G$ may be grown by epitaxial growth or by doping the portion 502 of the substrate 304. To insulate an eventually formed metal gate in the GAA FET 400G from the source/drain $S_G/D_G$ and a drain/source $D_G/S_G$, insulating gate spacers 512G(1), 512G(2) are formed as shown. The gate spacers 512G(1), 512G(2) may be provided as a dielectric material, such as a Nitride-based low-k material, or a dielectric medium such as air for example. An interlayer dielectric material (ILD) 510 is shown formed around the GAA FET 400G to isolate active components of the GAA FET 400G from other devices formed in the semiconductor die 300 near the FinFET 400F.

With continuing reference to FIG. 5, the FinFET 400F is also shown integrated on the common substrate 304 of the semiconductor die 300 in FIG. 3. The FinFET 400F in this example is also shown after a fabrication stage after an etch is performed to form an opening 515 to provide for a metal gate material to be filled therein to form a gate for the FinFET 400F. As shown in FIG. 5, the FinFET 400F includes the fin channel structure 402F disposed on the substrate 304. The fin channel structure 402F includes a fin(s) 412 also of a semiconductor material. Note that the fin channel structure 402F can include one (1) fin 412 or multiple fins 412, which are not shown in FIG. 5 because of the orientation of the side view therein. In this example, the fin 412 is of a semiconductor material of the substrate 304, because the fin 412 is formed from an etch process of the substrate 304. As will be discussed in more detail below, the fin 412 of the GAA FET 402G could be formed in the substrate 304 by etching portions of substrate 304 down to the top surface 500T and such that the fin 412 is exposed and extends above the top surface 500T. The fin channel structure 402F has a top surface 514T that is formed in the first plane $P_1$ or substantially in the first plane $P_1$ above a top surface 516T of the substrate 304. The fin channel structure 402F extends above the STI layer 508 that defines a bottom surface 514B of the fin channel structure 402F in a plane $P_3$ that defines an overall height $H_F$ of the fin channel structure 402F. The heights $H_G$, $H_F$ of the GAA channel structure 402G and the fin channel structure 402F are in a direction orthogonal to a longitudinal axis $A_1$ of the substrate 304. The selection of the materials for the fin 412 as well as the overall height $H_F$ of the fin channel structure 402F are factors that affect the channel control and drive strength of the FinFET 400F. A source/drain $S_F/D_F$ and a drain/source $D_F/S_F$ are formed on adjacent sides of the fin channel structure 402F. For example, the source/drain $S_F/D_F$ and the drain/source $D_F/S_F$ may be grown by epitaxial growth or by doping end portions of the fin 412. To insulate an eventually formed metal gate in the FinFET 400F from the source/drain $S_F/D_F$ and the drain/source $D_F/S_F$, insulating gate spacers 512F(1), 512F(2) are formed as shown. The gate spacers 512F(1), 512F(2) may be provided as a dielectric material, such as a Nitride-based low-k material, or a dielectric medium such as air for example. The ILD 510 is also formed around the FinFET 400F to isolate active components of the FinFET 400F and the conducting local interconnects from other devices and local interconnects formed in the semiconductor die 300 near the FinFET 400F.

As shown in the example of the semiconductor die 300 in FIG. 3, the top surface 504T of the GAA FET 400G and the top surface 514T of the FinFET 400F are disposed in the same plane $P_1$ or in substantially the same plane $P_1$. This allows for common processes to be further employed to form interconnections in the middle of line (MOL) layers to the GAA FET 400G and FinFET 400F, because the interconnections can be made to the same planes or substantially to the same planes in the semiconductor die 300. However, it may be desired for a designer to be able to design the GAA FET 400G and the FinFET 400F to have particular parasitic resistances and capacitances and drive strengths, and to achieve the desired tradeoff between these design parameters. Thus, in this example, the Fin channel structure 402F of the FinFET 400F can be etched into the substrate 304 to the plane $P_3$ such that the bottom surface 514B of the fin channel structure 402F is lower than the plane $P_2$ at the bottom surface 504B of the GAA channel structure 402G. Alternatively, the fin channel structure 402F of the FinFET 400F can be etched into the substrate 304 to the plane $P_2$ such that the bottom surface 514B of the fin channel structure 402F is in the plane $P_2$ or substantially in the plane $P_2$ with the bottom surface 504B of the GAA channel structure 402G. The fin channel structure 402F of the FinFET 400F can be etched into the substrate 304 at any depth desired to control the height $H_F$ of the fin channel structure 402F independent of the height $H_G$ of the GAA channel structure 402G. Thus, the GAA FET 400G and the FinFET 400F are formed starting from the common substrate 304, but the GAA FET 400G and the FinFET 400F can be formed with some degree of independence in terms of their design parameters that will affect parasitic resistances and capacitances and drive strengths to achieve the desired performances in the respective ICs in which the GAA FET 400G and the FinFET 400F are included.

For example, as shown in FIG. 5, to control the height $H_F$ of the fin channel structure 402F independent of the height $H_G$ of the GAA channel structure 402G, the STI layer 508 may be processed to be exposed differently adjacent to the GAA channel structure 402G and the fin channel structure 402F. For example, the STI layer 508 may include a top surface 509T adjacent to the GAA channel structure 402G that is disposed in the plane $P_2$, whereas another a top surface 511T adjacent to the fin channel structure 402F may be disposed in a different plane $P_3$ below plane $P_2$. Or alternatively, the top surface 509T of the STI layer 508 adjacent to the GAA channel structure 402G may be disposed also in the plane $P_2$. Or alternatively, the top surface 509T of the STI layer 508 adjacent to the GAA channel structure 402G may be disposed also in the plane $3_2$ below plane $P_2$.

There can be process challenges to integrating a GAA FET and FinFET, such as the GAA FET 400G and the FinFET 400F, into a common substrate. For example, using the GAA FET 400G and the FinFET 400F integrated on the common substrate 304 in FIG. 5, the GAA channel structure 402G includes sacrificial structures in a heterogeneous structure where the separation areas 406(1)-406(2) are located to be able to etch the separation areas 406(1)-406(2) between the nanostructures 404(1)-404(3) for a gate material to be disposed therein for gate control. However, the FinFET 400F only requires a homogeneous semiconductor material for the fin 412. Thus, the GAA FET 400G includes the GAA channel structure 402G that is different from the fin channel structure 402F of the FinFET 400F. Also, controlling the heights $H_G$, $H_F$ of the respective GAA channel structure 402G and the fin channel structure 402F can also pose process challenges.

Figure 6A:
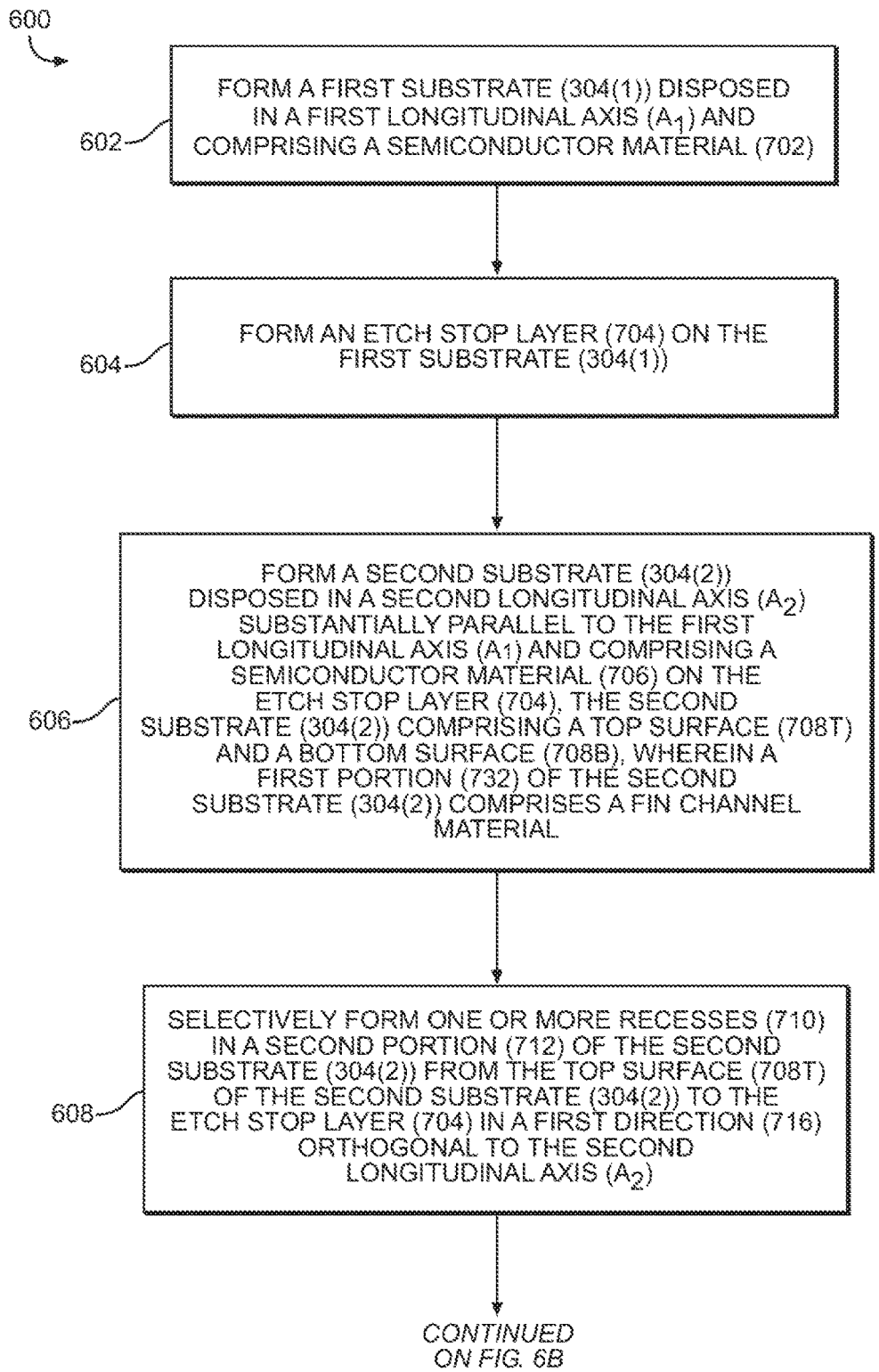
FIGS. 6A and 6B are a flowchart illustrating an exemplary process of fabricating a GAA FET(s) and a FinFET(s) integrated on a common substrate of a semiconductor die.
Figure 6B:
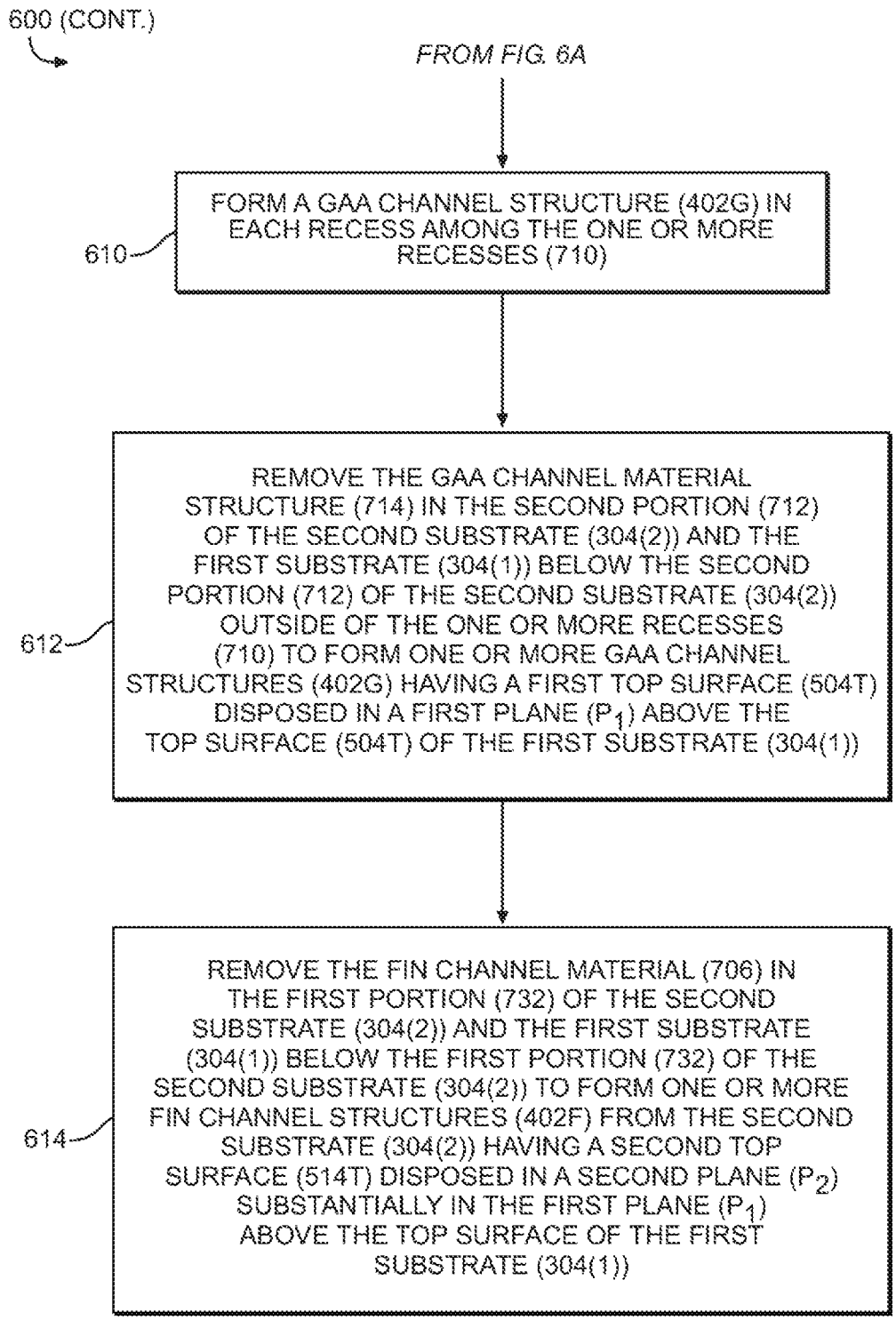

In this regard, FIGS. 6A and 6B are a flowchart illustrating an exemplary process 600 of fabricating a GAA FET(s) and a FinFET(s) integrated on a common substrate of a semiconductor die. The exemplary process 600 in FIG. 6 will be described with regard to and in conjunction with exemplary fabrication stages in FIGS. 7A-7M of a semiconductor die that includes a GAA FET and a FinFET integrated on a common substrate. FIGS. 6 and 7A-7M will be discussed in reference to the exemplary semiconductor die 300 in FIG. 5 that includes the GAA FET 400G and the FinFET 400F integrated on the common substrate 304.

Figure 7A:
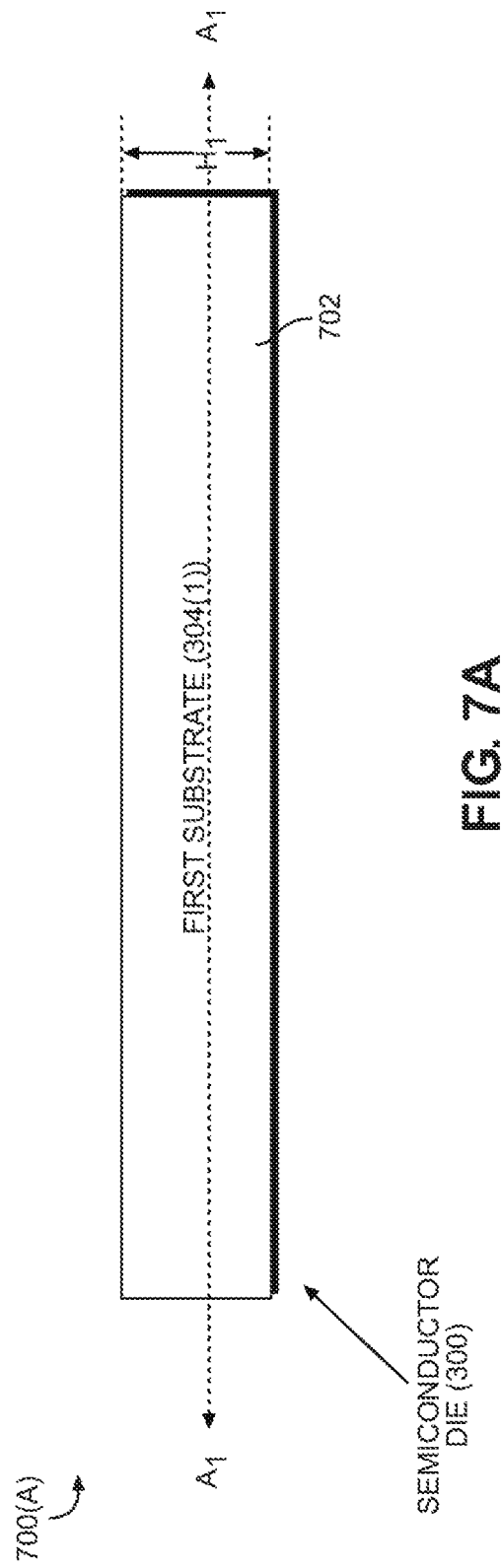
FIG. 7A illustrates a side view of an exemplary fabrication stage of forming a bulk wafer to form a substrate for a semiconductor die, as part of a process of fabricating a FinFET and a GAA FET integrated on a common substrate of a semiconductor die.
Figure 7B:
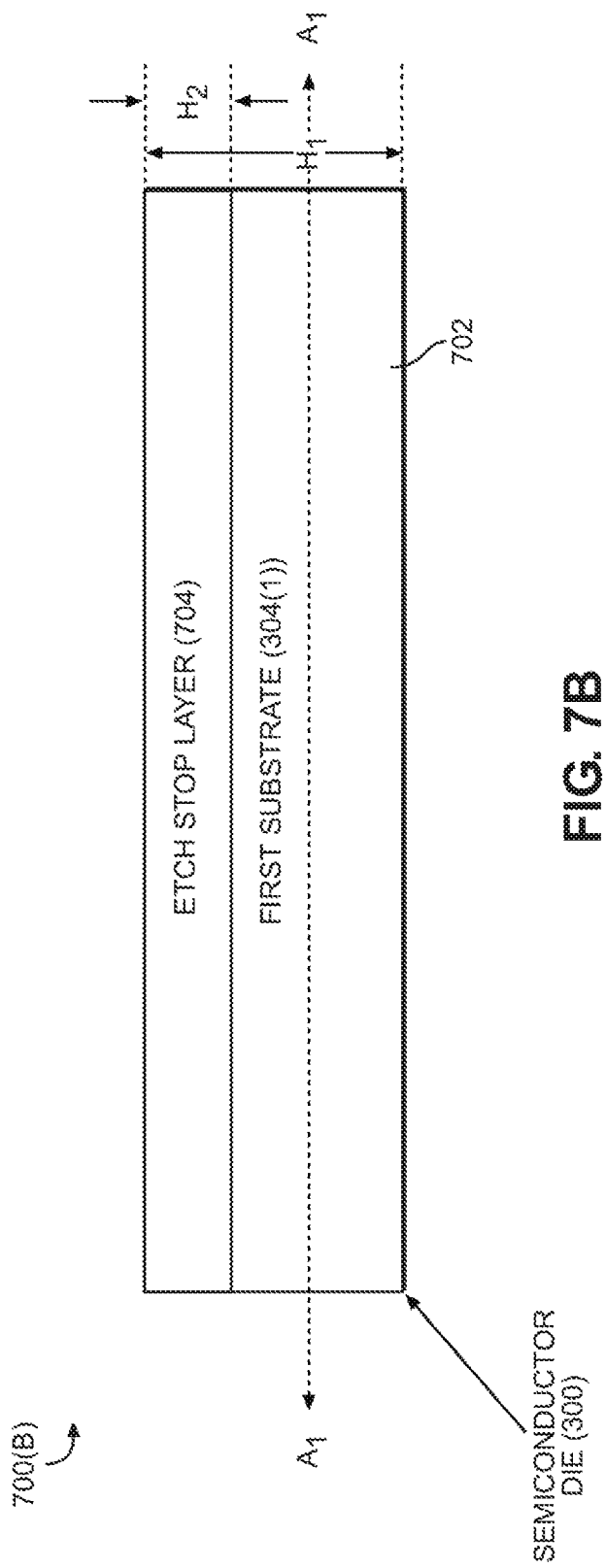
FIG. 7B illustrates a side view of another exemplary fabrication stage of forming an etch stop layer on the substrate in the fabrication stage of the semiconductor die in FIG. 7A, as part of a process of fabricating a FinFET and a GAA FET integrated on a common substrate of a semiconductor die.
Figure 7C:
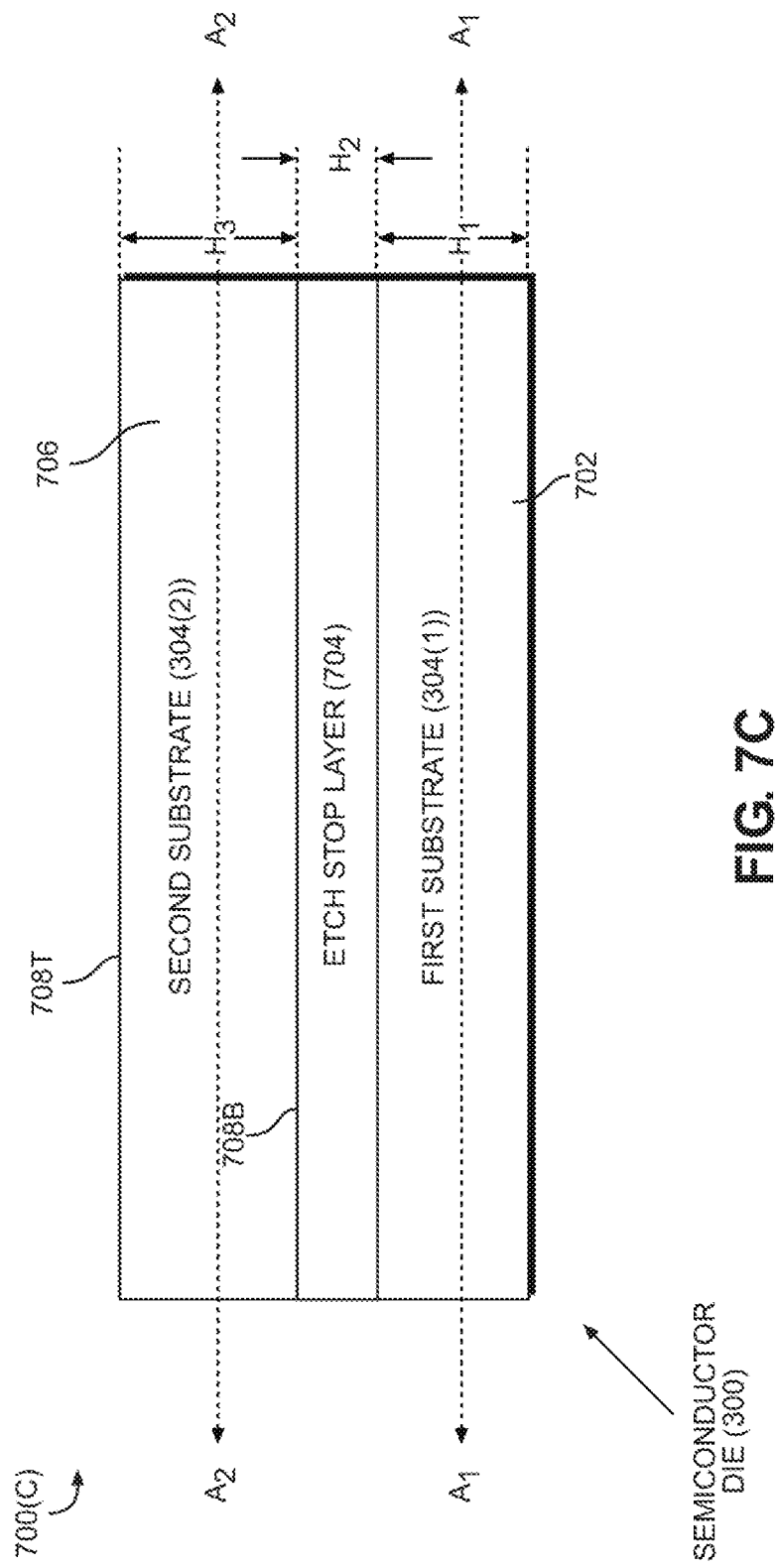
FIG. 7C illustrates a side view of another exemplary fabrication stage of forming a semiconductor channel material layer on the etch stop layer in the fabrication stage of the semiconductor die in FIG. 7B, as part of a process of fabricating a FinFET and a GAA FET integrated on a common substrate of a semiconductor die.
Figure 7G:
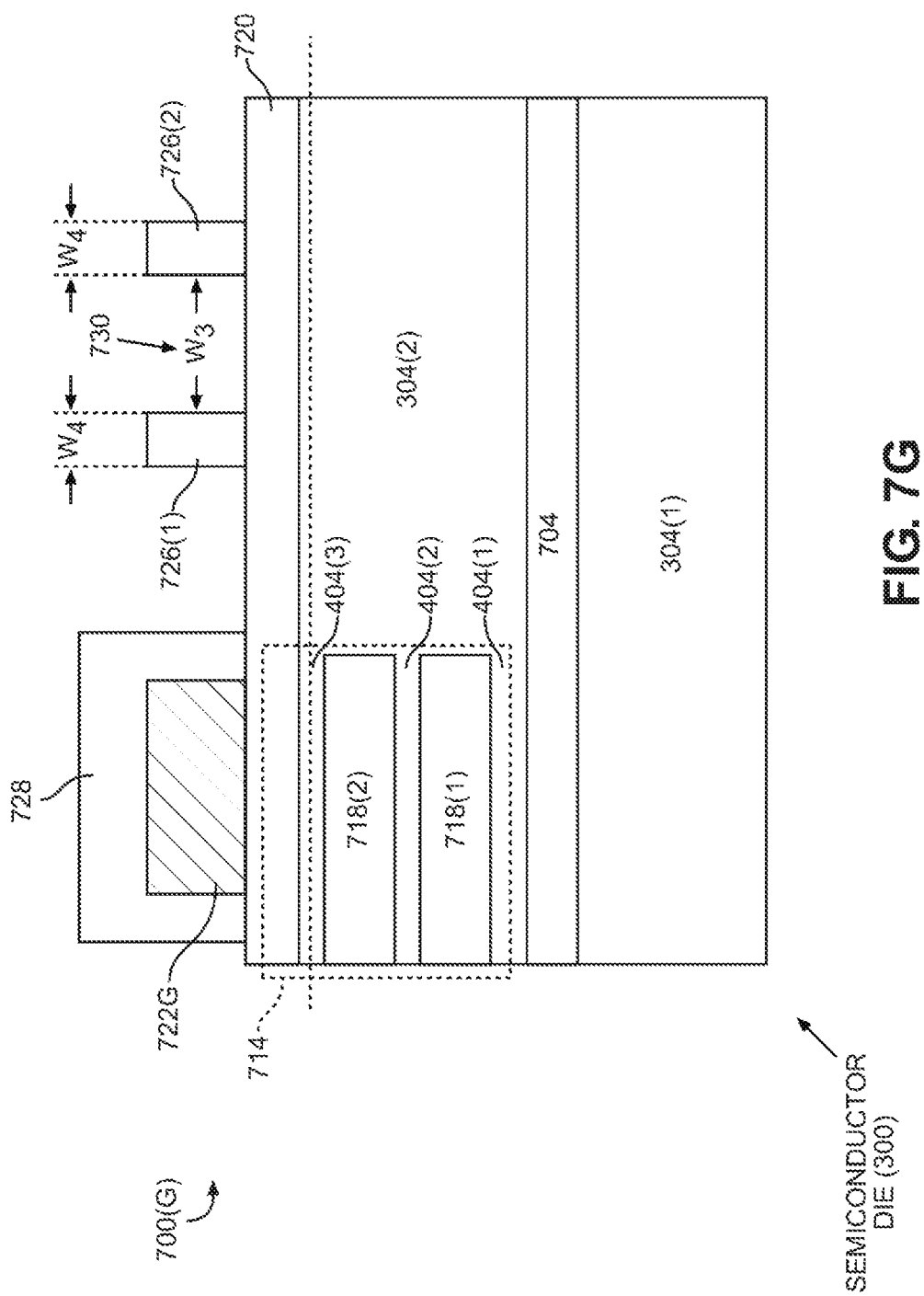
FIG. 7G illustrates a side view of another exemplary fabrication stage of removing the mandrel between the spacers formed above the FinFET channel structure in the fabrication stage of the semiconductor die in FIGS. 7F-1 and 7F-2, as part of a process of fabricating a FinFET and a GAA FET integrated on a common substrate of a semiconductor die.

In this regard, as shown in FIG. 6A, a first exemplary step in the process 600 to fabricate the GAA FET 400G and the FinFET 400F integrated on the substrate 304 of the semiconductor die 300 is to form a first substrate 304(1) disposed in a first longitudinal axis $A_1$ (block 602 in FIG. 6A). FIG. 7A illustrates a side view of a fabrication stage 700(A) of the semiconductor die 300 that shows the formed first substrate 304(1)). The first substrate 304(1) is formed from a semiconductor material 702, such as Si for example. This is shown in the exemplary fabrication stage 700(A) of the semiconductor die 300 in FIG. 7A. A well and ground plane may be formed in the first substrate 304(1), as shown by the notations "Well" and "GP" in FIG. 7A. The first substrate 304(1) may be of a first height $H_1$ between approximately 30 nm and 200 nm. FIG. 7B illustrates a side view of another fabrication stage 700(B) of the semiconductor die 300 where an etch stop layer 704 is disposed on the first substrate 304(1)) (block 604 in FIG. 6A). For example, the etch stop layer 704 may be epitaxially grown on the first substrate 304(1) and subsequently processed to be planarized. For example, the etch stop layer 704 may be a material that has an etch selectivity different from the semiconductor material of the first substrate 304(1) so that an etch process to etch will not etch below the etch stop layer 704 into the first substrate 304(1). For example, the etch stop layer 704 may be SiGe and the first substrate 304(1) may be Si. As another example, the etch stop layer 704 has a height $H_2$ between approximately 5 nm and 20 nm that may be much thinner than first substrate 304(1).

Another exemplary step in the process 600 to fabricate the GAA FET 400G and the FinFET 400F integrated on the substrate 304 of the semiconductor die 300 is to form a second substrate 304(2) on the etch stop layer 704 so that a recess can be formed in the second substrate 304(2) down to the etch stop layer 704 to form the GAA channel structure 402G for fabricating the GAA FET 400G (block 606 in FIG. 6A). In this manner, the GAA FET 400G and the FinFET 400F that will eventually be fabricated in the semiconductor die 300 will be integrated to the same common first substrate 304(1). This process step is shown in side view of the exemplary fabrication stage 700(C) of the semiconductor die 300 in FIG. 7C. As shown therein, the second substrate 304(2) is disposed in a second longitudinal axis $A_2$ parallel or substantially parallel to the first longitudinal axis $A_1$ on the etch stop layer 704. The second substrate 304(2) is of a second semiconductor material 706 that in this example is the same material as the semiconductor material 702 of the first substrate 304(1). As will be discussed and shown in more detail below, the semiconductor die 300 will be processed such that the etch stop layer 704 will diffuse into the first and/or second substrates 304(1), 304(2), such that the first and second substrates 304(1), 304(2) are part the monolithic substrate 304 as shown in FIG. 5. The second substrate 304(2) has a top surface 708T and a bottom surface 708B. A first portion 732 of the semiconductor material 706 of the second substrate 304(2) will comprise a fin channel material to form the fin 412 of the FinFET 400F that will be formed in the semiconductor die 300.

Figure 1A:
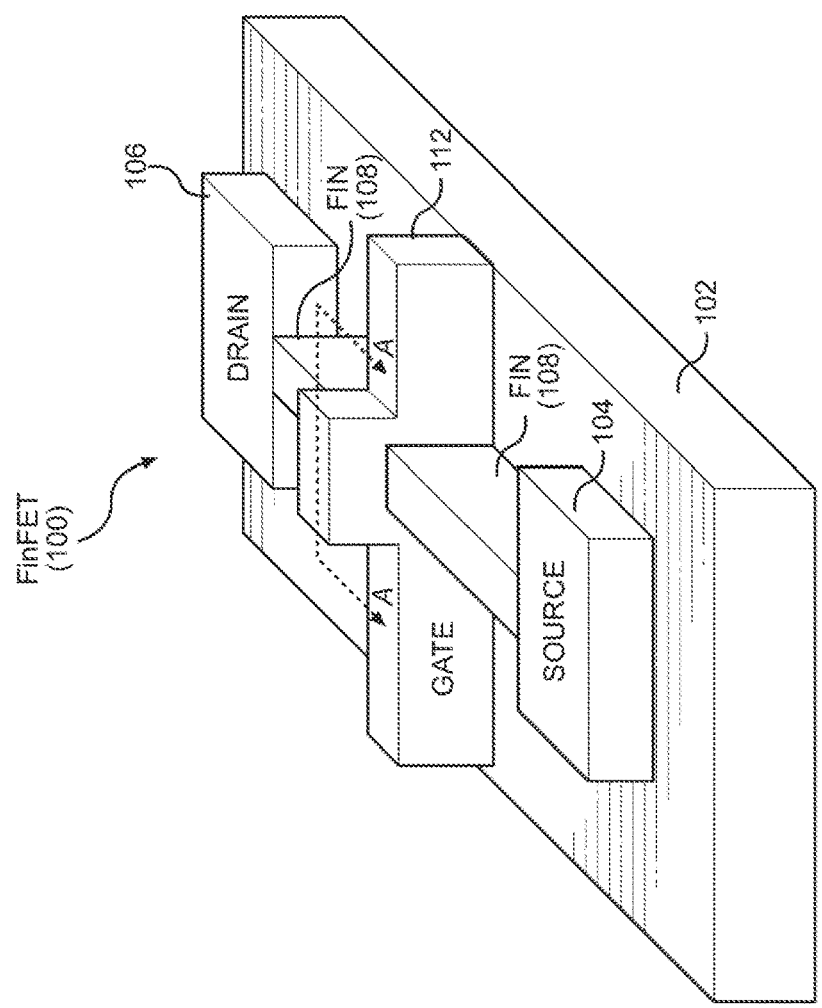
FIG. 1A illustrates an exemplary fin Field-Effect Transistor (FET) (FinFET)

Another exemplary step in the process 600 to fabricate the GAA FET 400G and the FinFET 400F integrated on the substrate 304 of the semiconductor die 300 is to selectively form a recess 710 in the second substrate 304(2) to the etch stop layer 704 to prepare for the GAA channel structure 402G to be formed in the recess 710 (block 608 in FIG. 6A). In this manner, the GAA channel structure 402G of the GAA FET 400G that will be fabricated in the semiconductor die 300 will be integrated to the same common first substrate 304(1). This process step is shown in the side views of the exemplary fabrication stages 700(D-1), 700(D-2) of the semiconductor die 300 in FIGS. 7D-1 and 7D-2. As shown in FIG. 7D-1, the recess 710 is formed in a second portion 712 of the second substrate 304(2) from the top surface 708T of the second substrate 304(2) to the etch stop layer 704 in a first direction 716 orthogonal or substantially orthogonal to the second longitudinal axis $A_2$. Thereafter, as shown in FIG. 7D-2, a GAA channel material structure 714 is formed in the recess 710 that will eventually be processed to form the GAA channel structure 402G for the GAA FET 400G (FIG.

5) (block 610 in FIG. 6B). As shown in FIG. 7D-2, the GAA channel material structure 714 includes a plurality of alternating layers of the nanostructures 404(1)-404(3) and etch selective layers 718(1)-718(3) that will allow etching between the nanostructures 404(1)-404(3) to form the separation areas 406(1)-406(3) as shown in the GAA FET 400G in FIG. 5. The recess 710 is formed such that the GAA channel structure 402G that will be formed from the GAA channel material structure 714 and the fin channel structure 402F (FIG. 5) that will be formed in the semiconductor die 300 share the same bottom second plane $P_2$. This formation of the GAA channel structure 402G for the GAA FET 400G in the second substrate 304(2) that will also be processed to form the fin channel structure 402F for the FinFET 400F (FIG. 5) can allow for common etch processes to be employed to form the GAA channel structure 402G and the fin channel structure 402F.

Note that after the GAA channel material structure 714 is formed in the recess 710, a planarization process can be performed to planarize the top surface of the GAA channel material structure 714 to the top surface 708T of the second substrate 304(2). For example, a chemical mechanical planarization (CMP) process may be performed. This may avoid the need to provide any further filler layers, such as an additional epitaxially grown layer to adjust the height of the GAA channel material structure 714.

Processes are then employed to form the GAA channels structure 402G of a fabricated GAA FET 400G and the fin channel structure 402F of a fabricated FinFET 400F integrated on the common first substrate 304(1). It may desired to employ common processes for etching the second substrate 304(2) so that the GAA channel structure 402G and the fin channel structure 402F are efficiently performed. In one exemplary process, a single-step mandrel transfer process can be employed. In this regard, FIGS. 7E-1 and 7E-2 illustrate side and top views, respectively, of another exemplary fabrication stage 700(E) of forming a hard mask layer 720 and respective mandrels (i.e., masks) 722G, 722F above the GAA channel material structure 714 and the second substrate 304(2) where the fin 412 of the fin channel structure 402F will be formed using a lithography process. As shown in FIG. 7E-1, the hard mask layer 720 is formed above the top surface 708T of the second substrate 304(2). A first mandrel 722G is formed above the GAA channel material structure 714. The width $W_2$ of the first mandrel 722G is provided to be the desired width of the GAA channel structure 402G that will be formed from the GAA channel material structure 714 as the first mandrel 722G will provide an etch mask for the GAA channel material structure 714. For example, the width $W_2$ may be between approximately 12-30 nm. A second mandrel 722F is formed above the fin channel material 706 in the second substrate 304(2). The width $W_3$ of the second mandrel 722F is provided to be the desired width of the fin channel material 706 in the second substrate 304(2) to be removed with the remaining portion of the fin channel material 706 forming the fin 412, as the second mandrel 722F will provide for adjacent spacers to be formed thereto to provide an etch mask for the fin channel material 706. FIG. 7E-2 illustrates a top view of a mask 724 that shows the mandrel patterning of the mandrels 722G, 722G to be used to form the first and second mandrels 722G, 722F of the desired widths and patterning.

Another exemplary step in the process 600 to fabricate the GAA FET 400G and the FinFET 400F integrated on the substrate 304 of the semiconductor die 300 is shown in fabrication stage 700(F) in FIGS. 7F-1-7F-2. As shown in side view in FIG. 7F-1, spacers 726(1), 726(2) are formed on sides on adjacent to opposing sides of the second mandrel 722F that will provide masks over regions of the second substrate 304(2) that will eventually form the fin channel structure 402F. The spacers 726(1), 726(2) are of width $W_4$ in this example. For example, the width $W_4$ may be between approximately 5-10 nm. The formation of the spacers 726(1), 726(2) allows the formation of the fin channel structure 402F in a manner that may not be achievable with conventional lithography. FIG. 7F-2 is a top view of the semiconductor die 300 in FIG. 7F-1 illustrating the spacers 726(1), 726(2) that are formed on sides, adjacent to opposing sides of the second mandrel 722F. A hard mask 728 is also formed over the first mandrel 722G to protect the first mandrel 722G, because as shown in the side view in a subsequent fabrication stage 700(G) in FIG. 7G, the second mandrel 722F is then removed, such as through a lithography process, to leave an opening 730 of approximately the width $W_3$ between the spacers 726(1), 726(2). The spacers 726(1), 726(2) form a mask during etching of the second substrate 304(2) to form the fin channel structure 402F. Examples of materials for the spacers 726(1), 726(2) include, but are not limited to, SiN, SiOC, AlN, and oxide. The hard mask 728 may be of a TiN or SiN material as examples. The fin channel structure 402F will be formed from the second substrate 304(2) and also possibly the first substrate 304(1) that is located beneath the spacers 726(1), 726(2). Another exemplary step in the process 600 to fabricate the GAA FET 400G and the FinFET 400F integrated on the substrate 304 of the semiconductor die 300 is shown in fabrication stage 700(H) in FIG. 7H. As shown in side view in FIG. 7H, the hard mask 728 protecting the first mandrel 722G is removed after the second mandrel 722F is removed.

Figure 7I:
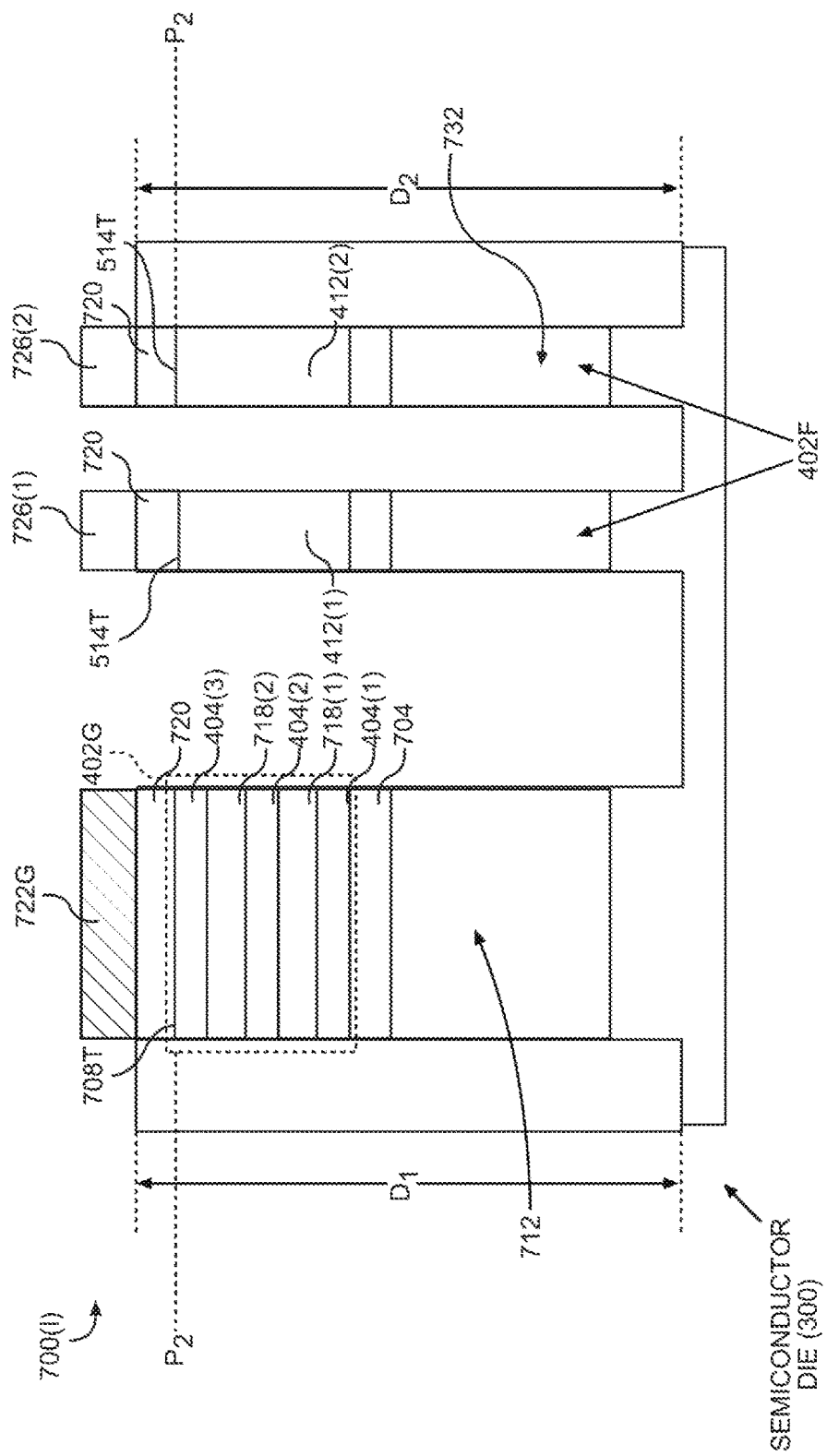
FIG. 7I illustrates a side view of another exemplary fabrication stage after etching the GAA channel material outside of the mandrel formed above the GAA channel material and FinFET channel structure between the spacers, as part of a process of fabricating a FinFET and a GAA FET integrated on a common substrate of a semiconductor die.

Another exemplary step in the process 600 to fabricate the GAA FET 400G and the FinFET 400F integrated on the substrate 304 of the semiconductor die 300 is to remove the GAA channel material structure 714 in the second portion 712 of the second substrate 304(2) and the first substrate 304(1) below the second portion 712 of the second substrate 304(2) outside of the recess 710 to form the GAA channel structure 402G for the GAA FET 400G (block 612 in FIG. 6B). Similarly, another exemplary step in the process 600 to fabricate the GAA FET 400G and the FinFET 400F integrated on the substrate 304 of the semiconductor die 300 is to remove the fin channel material 706 in the first portion 732 of the second substrate 304(2) below the first portion 732 of the second substrate 304(2) to form the fin channel structures 402F for the FinFET 400F (block 614 in FIG. 6B). This is shown in the exemplary fabrication stage 700(I) of the semiconductor die in FIG. 7I. As shown therein, the GAA channel material structure 402G in the second portion 712 of the second substrate 304(2) and the first substrate 304(1) below the second portion 712 of the second substrate 304(2) outside of the recess 710 is removed to a first depth $D_1$ to form the GAA channel structure 402G. In this example, removing the GAA channel material structure 714 is performed by etching the GAA channel material structure 714 outside of the first mandrel 722G to the first depth $D_1$ to form the GAA channel structure 402G. As also shown in FIG. 7I, the fin channel material 706 in the first portion 732 of the second substrate 304(2) and the first substrate 304(1) below the first portion 732 of the second substrate 304(2) is etched to a second depth $D_2$ in this example to form the fin channel structure 402F from the second substrate 304(2). The fin channel structure 402F has the second top surface 514T disposed in the second plane $P_2$ in the first plane $P_1$ or substantially in the first plane $P_1$ above the top surface of the first substrate 304(1). In this example, the fin channel material 706 in the first portion 732 of the second substrate 304(2) is removed by etching the fin channel material 706 in the first portion 732 of the second substrate 304(2) and the first substrate 304(1) below the first portion 732 of the second substrate 304(2) between the spacers 726(1), 726(2) to the second depth $D_2$ to form fins 412(1), 412(2) of the fin channel structure 402F. Using the mandrel 722G and the spacers 726(1), 726(2), the etching processes to form the GAA channel structure 402G and the fin channel structure 402F can be performed in the same etching process. The mandrel 722G and the spacers 726(1), 726(2) form a mask for the etching process. Thereafter, as shown in the fabrication stage 700(J) in FIG. 7J, the mandrel 722G and the spacers 726(1), 726(2) can be removed and the STI layer 508 disposed in the recesses formed where the second substrate 304(2) and the first substrate 304(1) where etched. Note that the widths of the fins 412(1), 412(2) in the fin channel structure 402F are of the width $W_4$ or substantially the width $W_4$ of the spacers 726(1), 726(2), because the spacers 726(1), 726(2) form a mask during the etching.

FIGS. 7K-1-7K-3 illustrate additional fabrication stages 700(K-1), 700(K-2), 700(K-3). In fabrication stage 700(K-1) in FIG. 7K-1, another etch step is performed to remove and reveal a portion of the STI layer 508 to control the final exposure and bottom surfaces 504B, 514B of the GAA channel structure 402G and the fin channel structure 402F. In fabrication stage 700(K-2) in FIG. 7K-2, it if is desired for the bottom surfaces 504B, 514B of the GAA channel structure 402G and the fin channel structure 402F to not be in the same plane, a mask 734 can be disposed over either the GAA channel structure 402G or the fin channel structure 402F to then perform a further selective removal and reveal of the STI layer 508. In this example, the mask 734 is disposed over the fin channel structure 402F as shown in fabrication stage 700(K-2) to then perform a further selective removal and reveal of the STI layer 508 adjacent to the GAA channel structure 402G to increase the height $H_G$ of the GAA channel structure 402G to be greater than the height $H_F$ of the fin channel structure 402F, as shown in fabrication stage 700(K-3) in FIG. 7K-3. This process can be used to control the relative height $H_G$ of the GAA channel structure 402G and the height $H_F$ of the fin channel structure 402F while maintaining the top surfaces 504T, 514T of the GAA channel structure 402G and the fin channel structure 402F in the same plane or substantially the same plane as previously discussed.

Figure 7M:
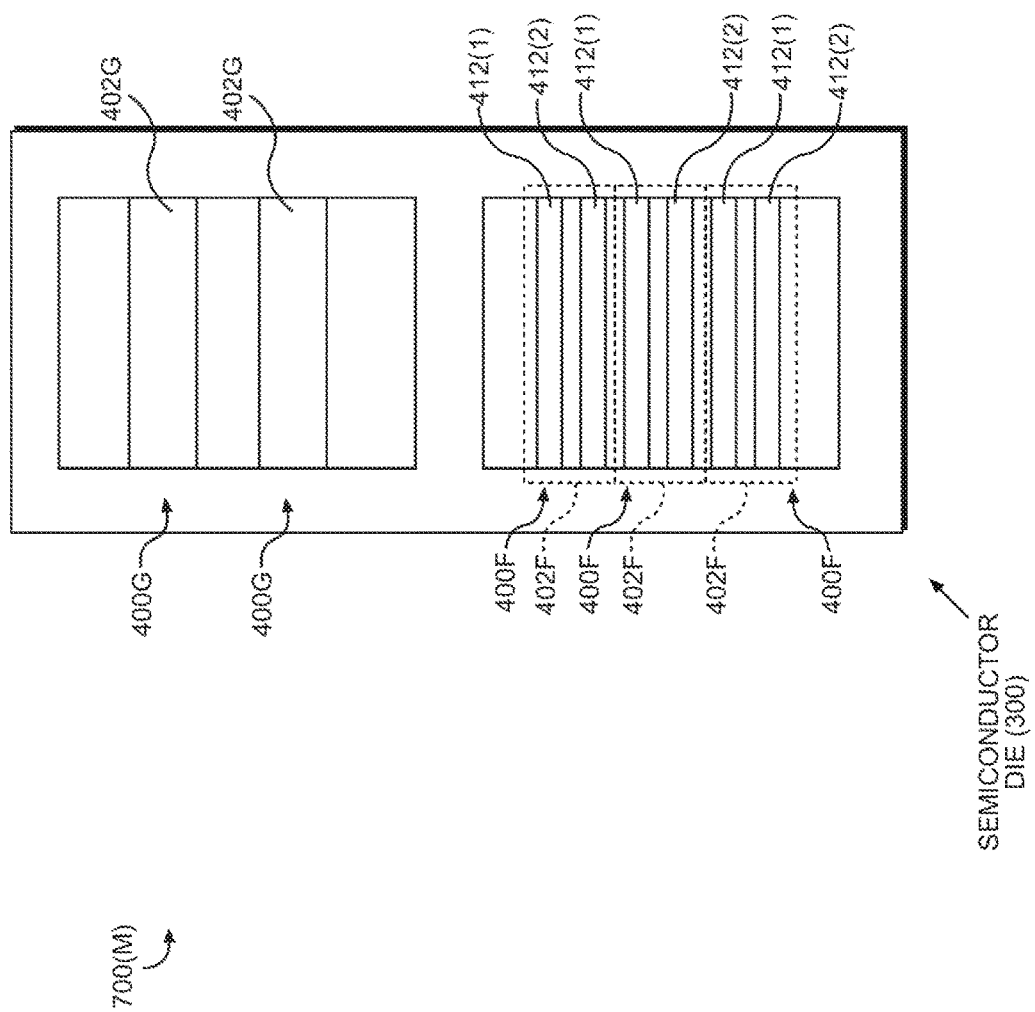
FIG. 7M is a top view of an exemplary final fabrication stage of a fabricated GAA FET and a FinFET integrated on a common substrate of a semiconductor die as part of the process of fabricating a channel structure for a GAA FET integrated with a FinFET on a common substrate of a semiconductor die in FIGS. 7A-7L-3.

FIGS. 7L-1-7L-3 illustrate additional fabrication stages 700(L-1), 700(L-2), 700(L-3). In fabrication stage 700(L-1) in FIG. 7L, another etch step is performed to remove and reveal a portion of the STI layer 508 to control the final exposure and bottom surfaces 504B, 514B of the GAA channel structure 402G and the fin channel structure 402F. In fabrication stage 700(L-2) in FIG. 7L-2, it if is desired for the bottom surfaces 504B, 514B of the GAA channel structure 402G and the fin channel structure 402F to not be in the same plane, the mask 734 can be disposed over the GAA channel structure 402G to then perform a further selective removal and reveal of the STI layer 508 adjacent to the fin channel structure 402F as shown in the fabrication stage 700(L-3) in FIG. 7L-3 to increase the height $H_F$ of the fin channel structure 402F to be greater than the height $H_G$ of the GAA channel structure 402G. This process can be used to control the relative height $H_F$ of the fin channel structure 402F and the height $H_G$ of the GAA channel structure 402G while maintaining the top surfaces 504T, 514T of the GAA channel structure 402G and the fin channel structure 402F in the same plane or substantially the same plane as previously discussed. FIG. 7M illustrates an additional fabrication stage 700(M) where a top down view of the semiconductor die 300 is shown. The GAA FETs 400G and FinFETs 400F, and their respective GAA channel structures 402G and fin channel structures 402F are shown. Note that the etch stop layer 704 may be diffused into the first substrate 304(1) during further annealing processing steps.

Alternative processes can be employed to fabricate a GAA FET and a FinFET integrated on the common substrate of a semiconductor die. For example, it may be desired to employ a two-step mandrel process to fabricate a GAA FET and a FinFET integrated on the common substrate of a semiconductor die. In this regard FIGS. 8A-8F illustrate a two-step mandrel process to fabricate a GAA FET and a FinFET integrated on the common substrate of a semiconductor die. The two-step mandrel process will be discussed in conjunction with the semiconductor die 300 and the GAA FET 400G and the FinFET 400F fabricated therein with common elements represented by common element numbers. The fabrication stages 700(A)-700(D) in FIGS. 7A-7D2 are also employed in this two-step mandrel process, and thus will not be repeated.

Figure 8A:
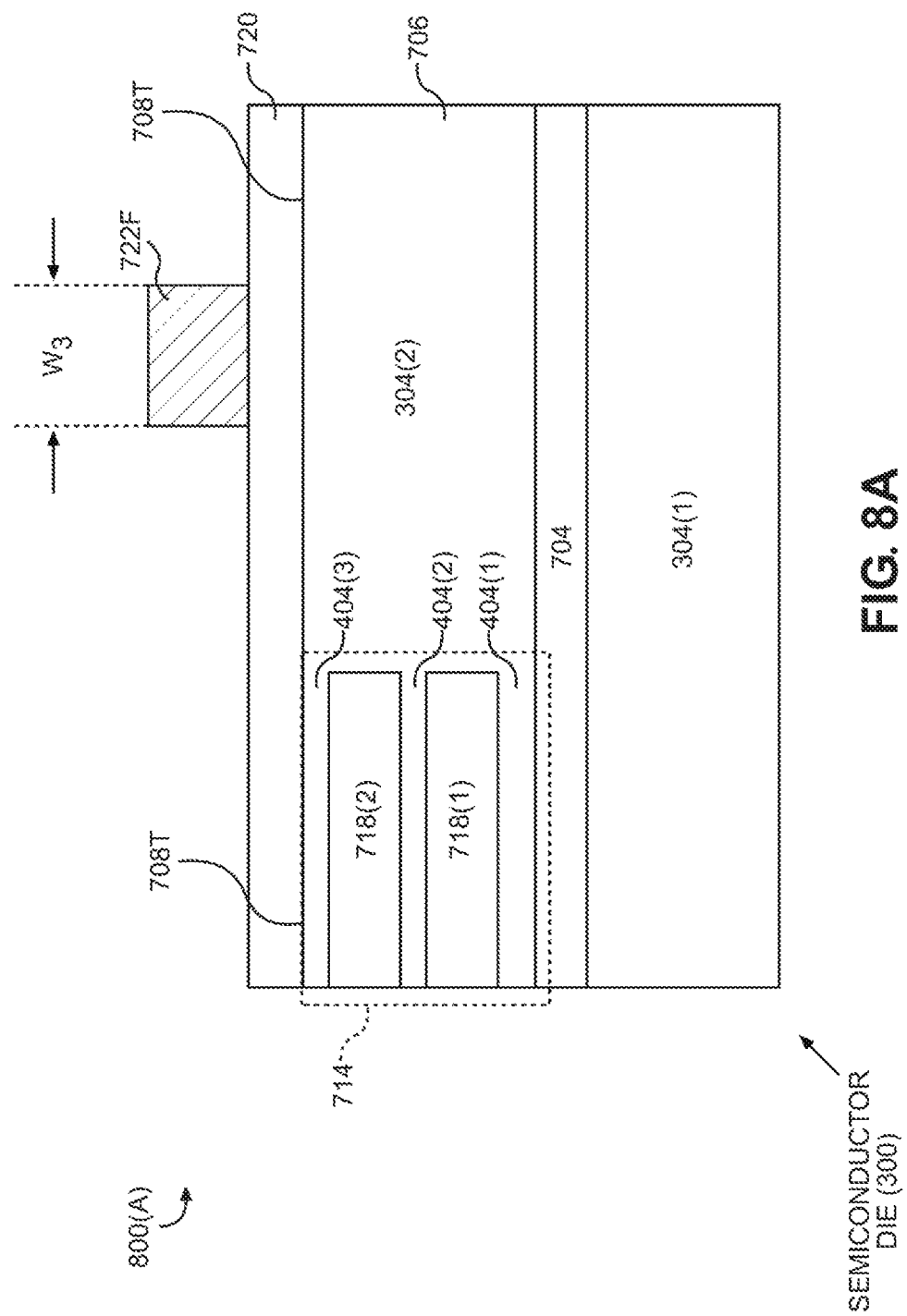
FIG. 8A illustrates a side view of an alternative exemplary fabrication stage to the fabrication stage in FIGS. 7E-1 and 7E-2 of forming a hard mask layer and a mandrel above FinFET channel structures using a lithography process, as part of a two-step mandrel transfer process as part of a process in the fabrication stage of the semiconductor die in FIGS. 7D-1 and 7D-2, as part of a process of fabricating a channel structure for a GAA FET integrated with the semiconductor die FinFET on a common substrate of a semiconductor die.

FIG. 8A illustrates a side view of an alternative exemplary fabrication stage 800(A) to the fabrication stage 700(E) in FIGS. 7E-1 and 7E-2 as part of a two-step mandrel process. In this regard, as shown in FIG. 8A, the hard mask layer 720 is formed above the top surface 708T of the second substrate 304(2) as shown in FIG. 7E-1. A mandrel is not formed above the GAA channel material structure 714, but rather the second mandrel 722F is formed above the fin channel material 706 in the second substrate 304(2). The width $W_3$ of the second mandrel 722F is provided to be the desired width of the fin channel material 706 in the second substrate 304(2) to be removed with the remaining portion of the fin channel material 706 forming the fin 412, as the second mandrel 722F will provide for adjacent spacers to be formed thereto to provide an etch mask for the fin channel material 706.

Figure 8B:
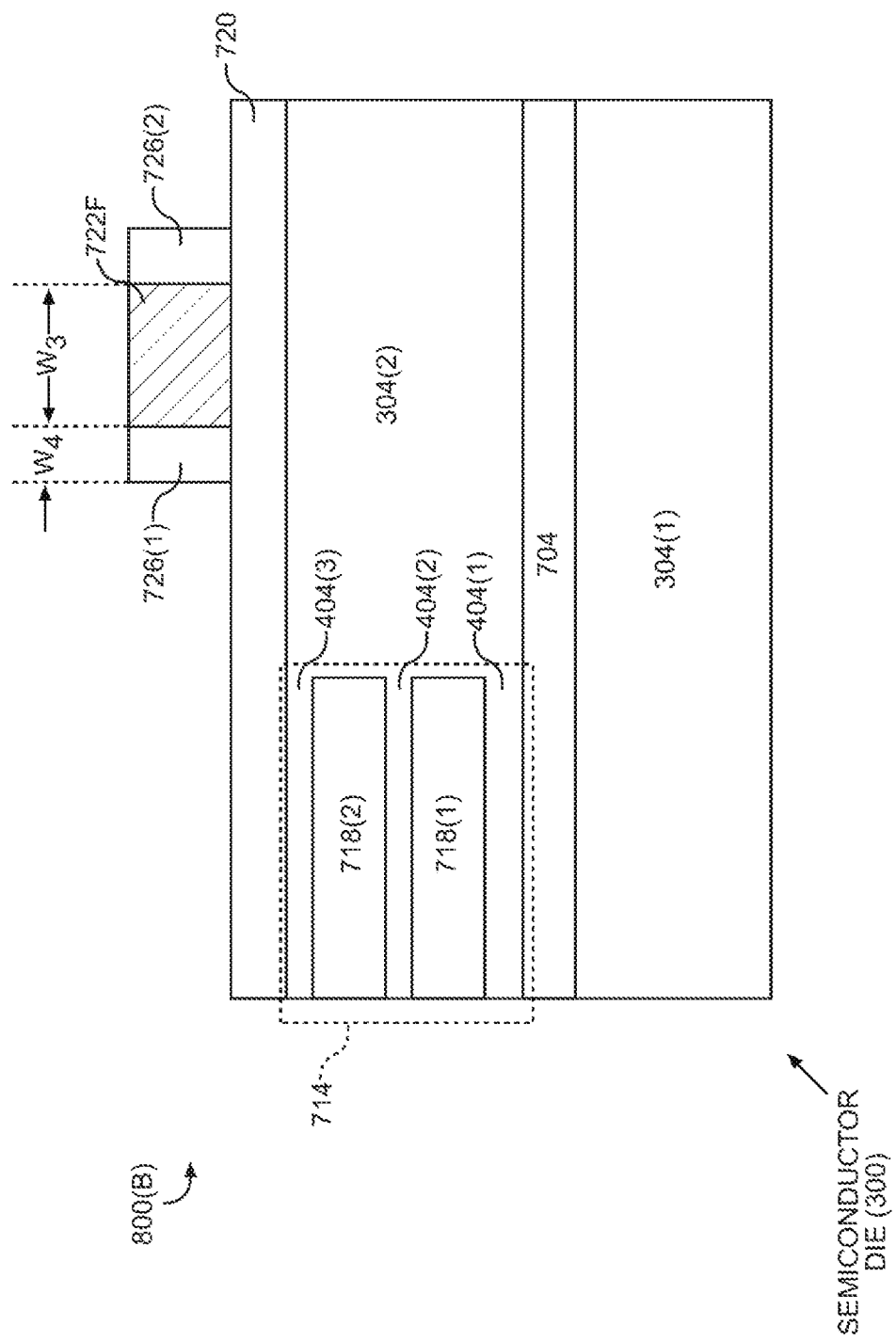
FIG. 8B illustrates a side view of another alternative exemplary fabrication stage to the fabrication stage in FIGS. 7F-1 and 7F-2 of forming spacers on sides of the mandrel formed over the FinFET channel structure in the fabrication stage of the semiconductor die in FIG. 8A, as part of a process of fabricating a channel structure for a GAA FET integrated with a FinFET on a common substrate of a semiconductor die.
Figure 8C:
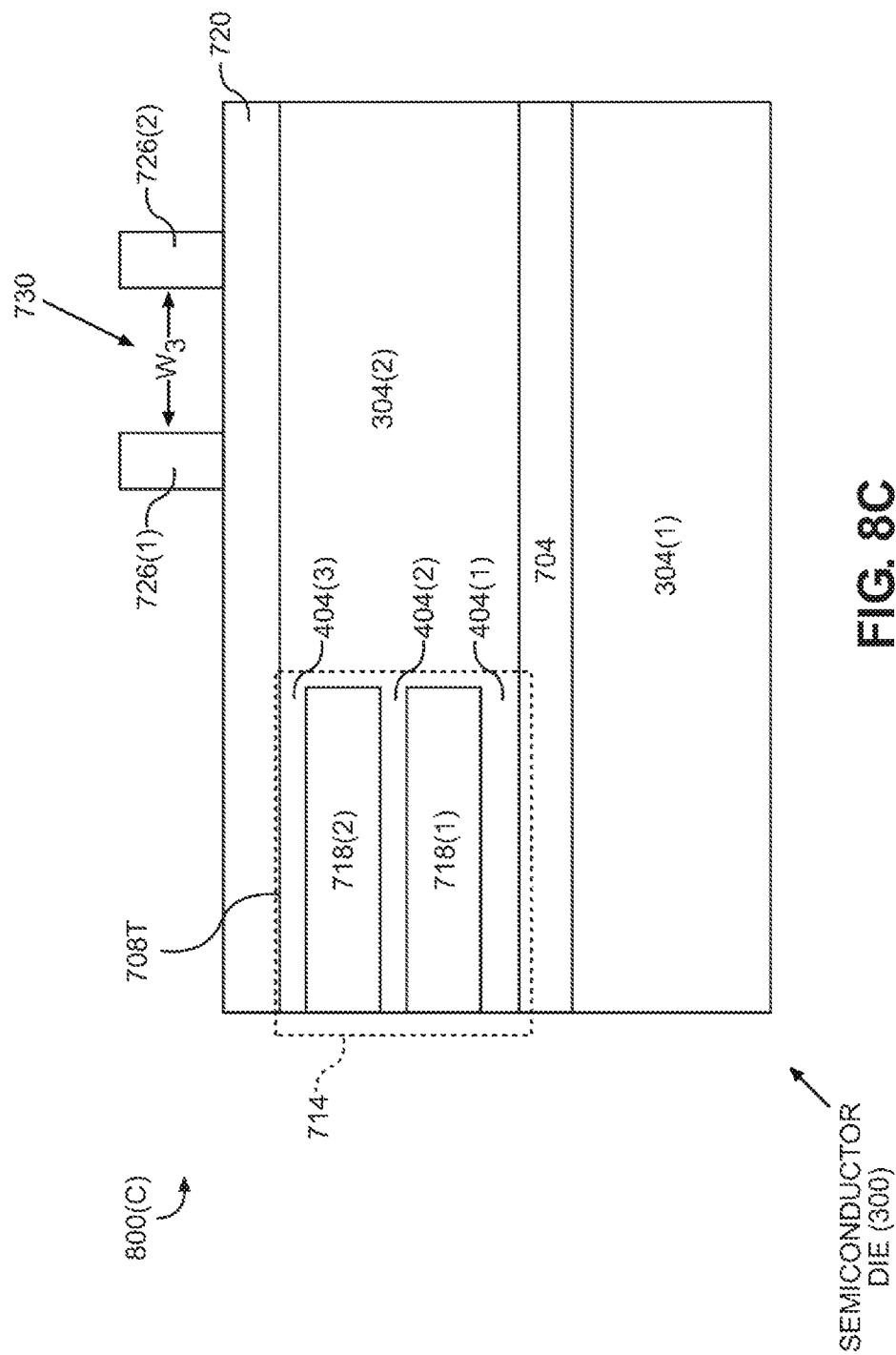
FIG. 8C illustrates a side view of another alternative exemplary fabrication stage of removing the mandrel between the spacers formed above the FinFET channel structure in the fabrication stage of the semiconductor die in FIG. 8B, as part of a process of fabricating a FinFET and a GAA FET integrated on a common substrate of a semiconductor die.

FIG. 8B illustrates a side view of another exemplary fabrication stage 800(B) of the semiconductor die 300 that is performed after the fabrication stage 800(A) in FIG. 8A. As shown in side view in FIG. 8B, the spacers 726(1), 726(2) are formed on sides on adjacent to opposing sides of the second mandrel 722F that will provide masks over regions of the second substrate 304(2) that will eventually form the fin channel structure 402F. The spacers 726(1), 726(2) are of the width $W_4$ in this example. For example, the width $W_4$ may be between approximately 5-10 nm. The formation of the spacers 726(1), 726(2) allow the formation of the fin channel structure 402F in a manner that may not be achievable with conventional lithography. Then, as shown in the fabrication stage 800(C) in FIG. 8C, the second mandrel 722F is then removed, such as through a lithography process, to leave the opening 730 of approximately the width $W_3$ between the spacers 726(1), 726(2). The spacers 726(1), 726(2) form a mask during etching of the second substrate 304(2) to form the fin channel structure 402F. The spacers 726(1), 726(2) may be of a SiN, SiOC, AlN, and oxide material(s) as examples. The hard mask 728 may be of a TiN and SiN material(s) as examples. The fin channel structure 402F will be formed from the second substrate 304(2) and also possibly the first substrate 304(1) that is located beneath the spacers 726(1), 726(2).

Figure 8D:
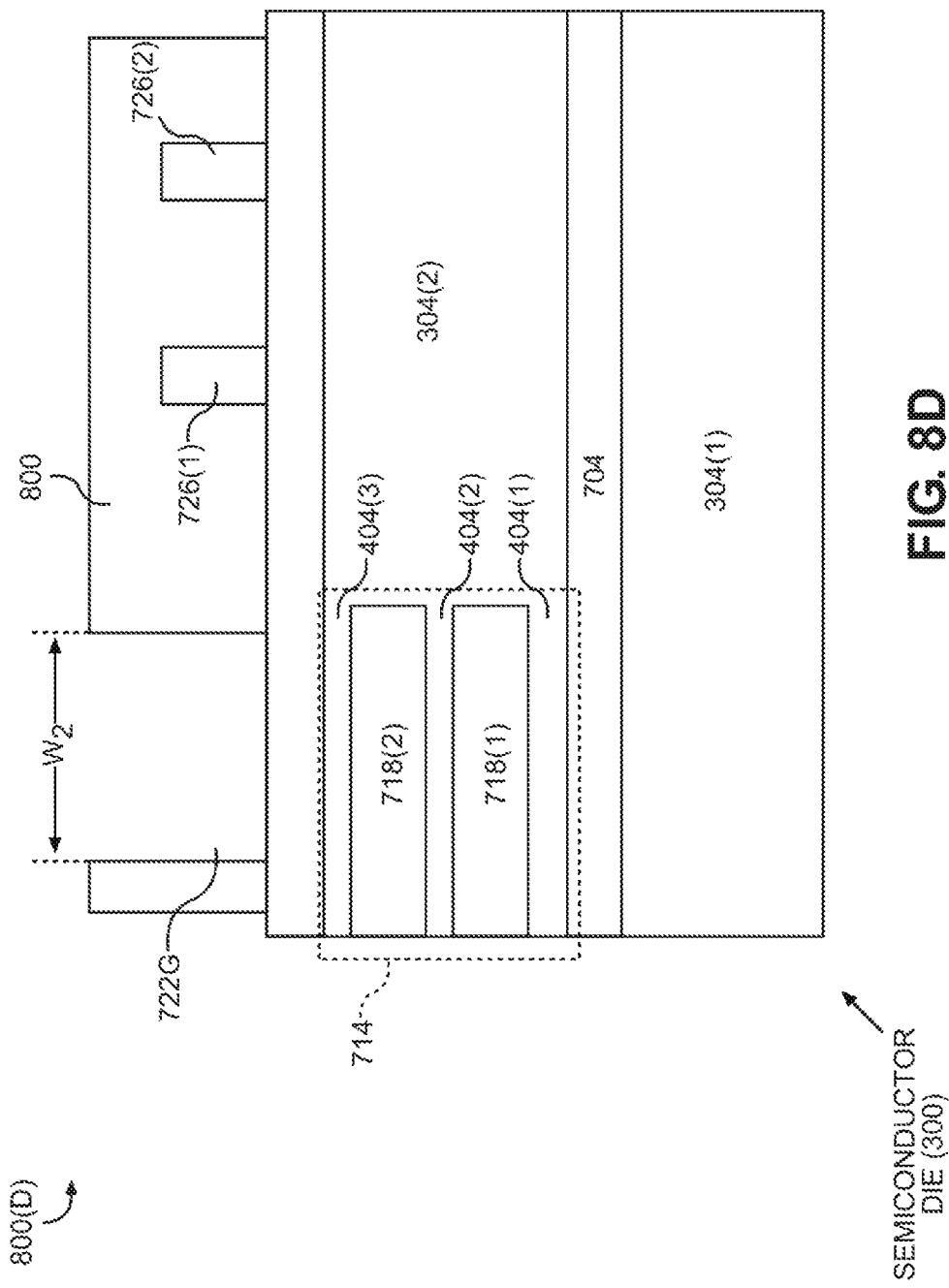
FIG. 8D illustrates a side view of another exemplary fabrication stage of an opening formed above the GAA channel structure from an exposed photoresist layer disposed above the hard mask layer in the fabrication stage of the semiconductor die in FIG. 8C, as part of a process of fabricating a FinFET and a GAA FET integrated on a common substrate of a semiconductor die.
Figure 8E:
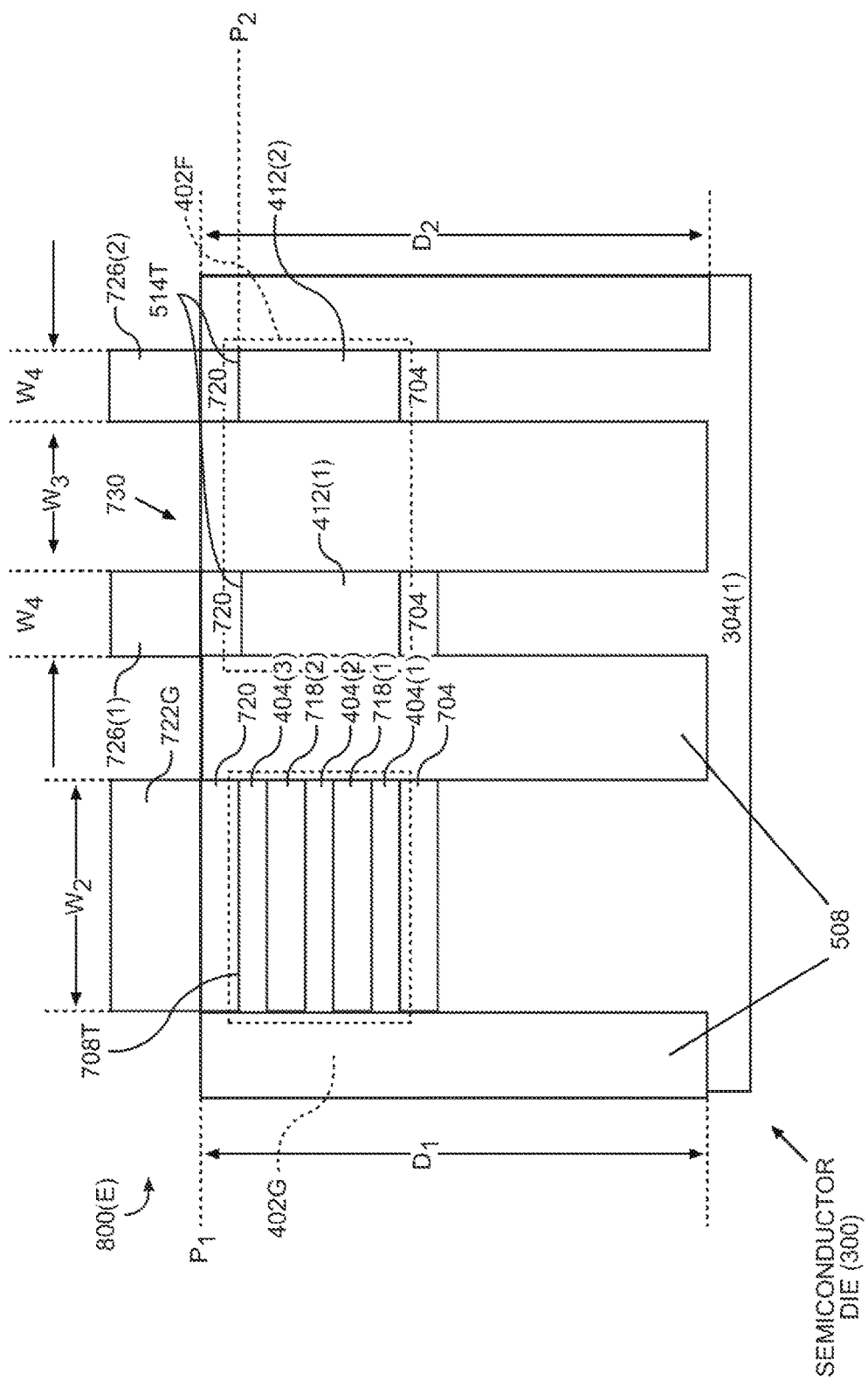
FIG. 8E illustrates a side view of another exemplary fabrication stage after etching below the photoresist material outside of the opening above the GAA channel material and the spacers above the FinFET channel material, as part of a process of fabricating a FinFET and a GAA FET integrated on a common substrate of a semiconductor die.

FIG. 8D illustrates a side view of another exemplary fabrication stage 800(D) of the semiconductor die 300. In a second mandrel step, a first mandrel 722G is formed above the GAA channel material structure 714 similar to that shown in the fabrication stage 700(E) in FIG. 7E-1. A hard mask material 802 is disposed over the first mandrel 722G and the spacers 726(1), 726(2) and into the opening 730. Thereafter, as shown in the fabrication stage 800(E) in FIG. 8E, the GAA channel material structure 714 in the second portion 712 of the second substrate 304(2) and the first substrate 304(1) below the second portion 712 of the second substrate 304(2) outside of the recess 710 is removed to the first depth $D_1$ to form the GAA channel structure 402G.

In this example, removing the GAA channel material structure 714 is performed by etching the GAA channel material structure 714 outside of the first mandrel 722G to the first depth $D_1$ to form the GAA channel structure 402G. As also shown in FIG. 7I, the fin channel material 706 in the first portion 732 of the second substrate 304(2) and the first substrate 304(1) below the first portion of the second substrate 304(2) is etched to a second depth $D_2$ in this example to form the fin channel structure 402F from the second substrate 304(2). The fin channel structure 402F has the second top surface 514T disposed in the second plane $P_2$ in the first plane $P_1$ or substantially in the first plane $P_1$ above the top surface of the first substrate 304(1). In this example, the fin channel material 706 in the first portion 732 of the second substrate 304(2) is removed by etching the fin channel material 706 in the first portion 732 of the second substrate 304(2) and the first substrate 304(1) below the first portion 732 of the second substrate 304(2) between the spacers 726(1), 726(2) to the second depth $D_2$ to form fins 412(1), 412(2) of the fin channel structure 402F. Using the mandrels 722G, 722F, and the spacers 726(1), 726(2), the etching processes to form the GAA channel structure 402G and the fin channel structure 402F can be performed in the same etching process. The mandrel 722G and the spacers 726(1), 726(2) form a mask for the etching process. The fabrication stages 700(J)-700(L-3) in FIGS. 7J-7L-3 can next be performed as previously described above.

Figure 8F:
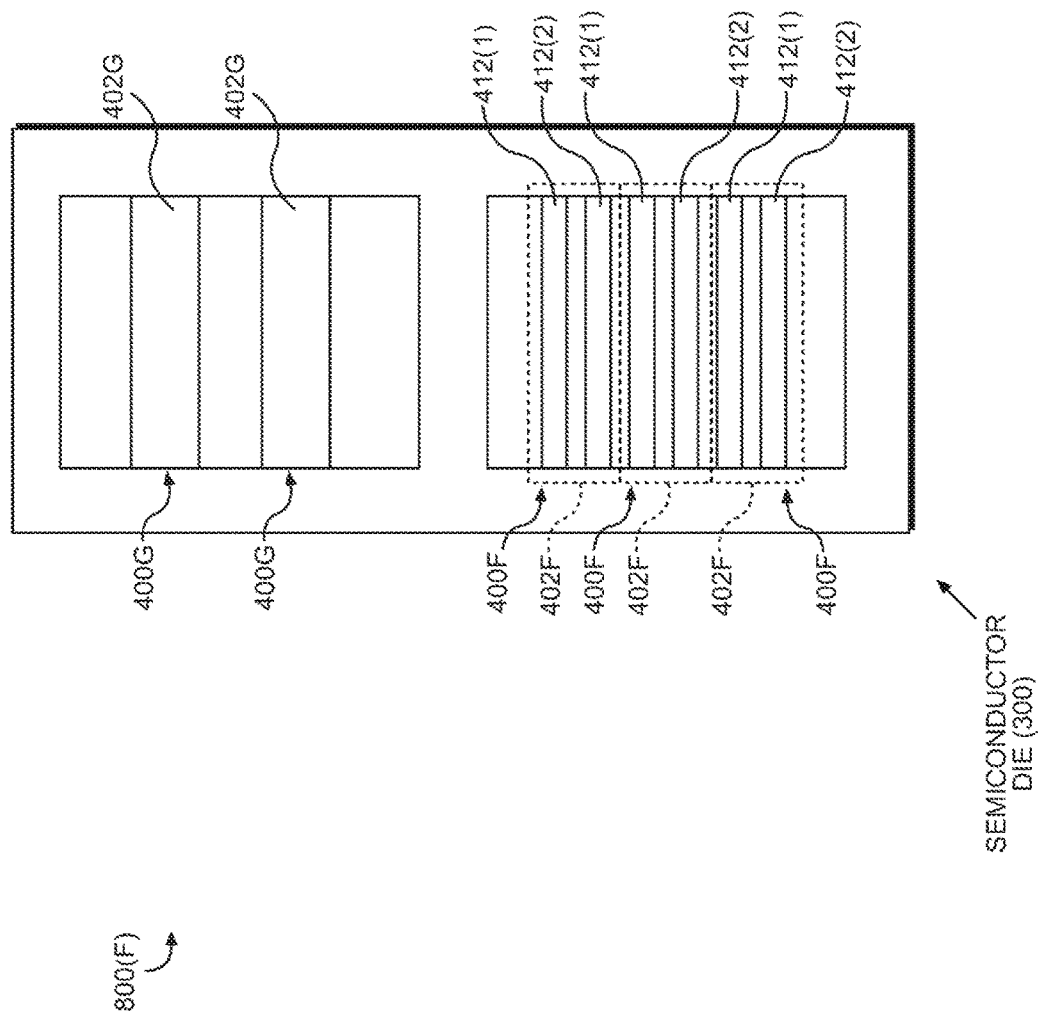
FIG. 8F is a top view of an exemplary final fabrication stage of a fabricated GAA FET and FinFET integrated on a common substrate of a semiconductor die as part of the process of fabricating a channel structure for a GAA FET integrated with a FinFET on a common substrate of a semiconductor die in FIGS. 7A-7D-2 and 8A-8E.

FIG. 8F illustrates an additional fabrication stage 800(F) where a top down view of the semiconductor die 300 is shown. The fabrication stage 800(F) may be provided after the fabrication stages 700(J)-700(L-3) in FIGS. 7J-7L-3 are performed as an example. The GAA FETs 400G and the FinFETs 400F, and their respective GAA channel structures 402G and fin channel structures 402F are shown. Note that the etch stop layer 704 may be diffused into the first substrate 304(1) during further annealing processing steps.

FIGS. 9A-9E illustrate another exemplary single-step mandrel process to fabricate a GAA FET and a FinFET integrated on the common substrate of a semiconductor die. As will be discussed in more detail below, this single-step mandrel process is a variation of the single-step mandrel process in FIGS. 7A-7M where spaces are additionally formed around the first mandrel 722G above the GAA channel material structure 714 to then form multiple GAA channel structures 402G. The single-step mandrel process in FIGS. 9A-9E will be discussed in conjunction with the semiconductor die 300 and the GAA FET 400G and the FinFET 400F fabricated therein with common elements represented by common element numbers. The fabrication stages 700(A)-700(E) in FIGS. 7A-7E-2 are also employed in this single-step mandrel process, and thus will not be repeated.

Figure 9A:
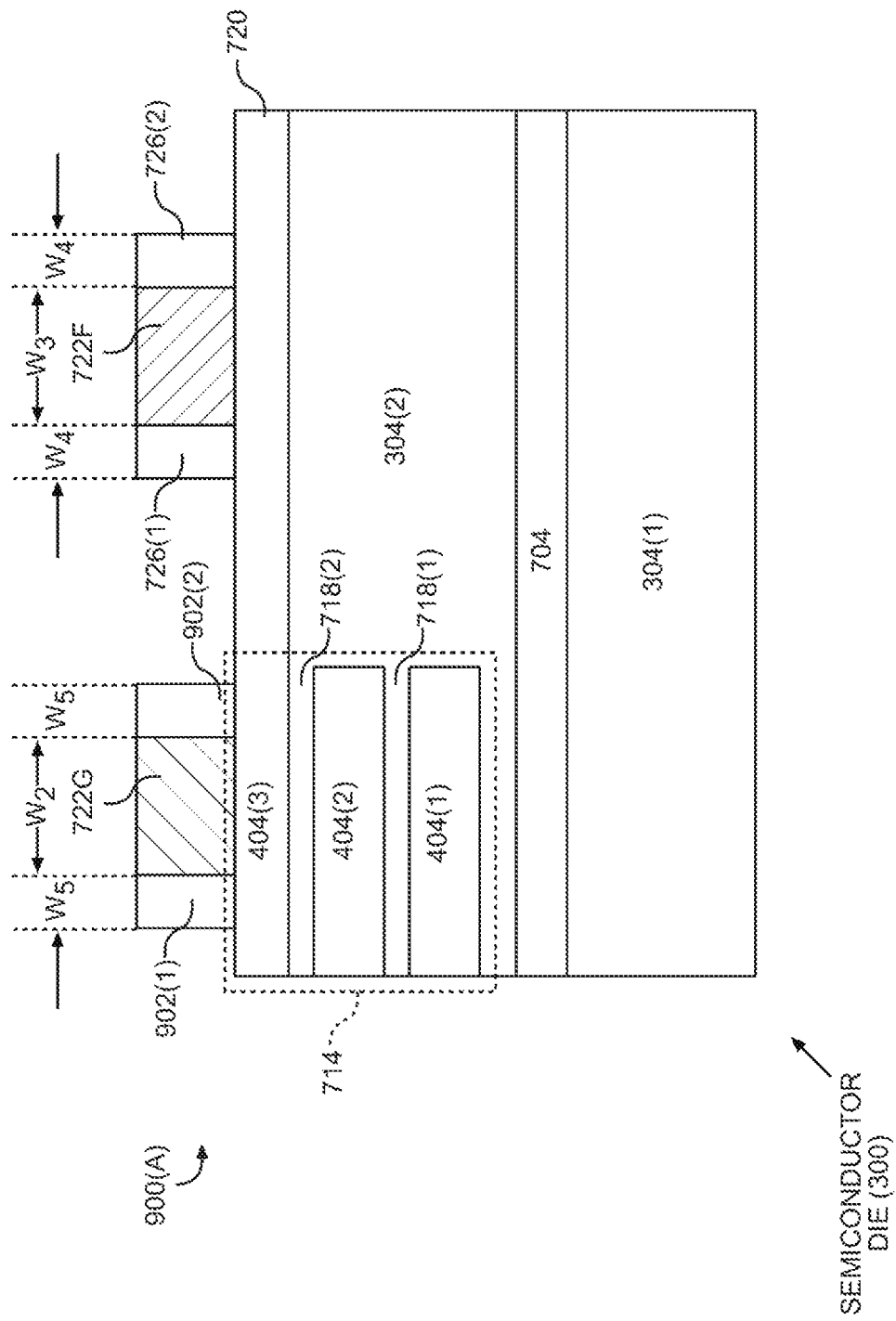
FIG. 9A illustrates a side view of another alternative exemplary fabrication stage to the fabrication stage in FIGS. 7F-1 and 7F-2 of forming spacers on sides of the mandrels formed over the GAA FET and FinFET channel structures in the fabrication stage of the semiconductor die in FIGS. 7E-1 and 7E-2, as part of a single-step mandrel transfer process as part of a process of fabricating a channel structure for a GAA FET integrated with a FinFET on a common substrate of a semiconductor die.

FIG. 9A illustrates a side view of another alternative exemplary fabrication stage to the fabrication stage 700(F) in FIGS. 7F-1 and 7F-2 of forming spacers on sides of the mandrels 722F, 722G formed over the GAA channel material structure 714 and the second substrate 304(2) in the fabrication stage 700(E) of the semiconductor die 300 in FIGS. 7E-1 and 7E-2, as part of a single-step mandrel transfer process. As shown in side view in FIG. 9A, the spacers 726(1), 726(2) are formed on sides, adjacent to opposing sides of the second mandrel 722F that will provide masks over regions of the second substrate 304(2) that will eventually form the fin channel structure 402F. The formation of the spacers 726(1), 726(2) allow the formation of the fin channel structure 402F in a manner that may not be achievable with conventional lithography. As also shown in side view in FIG. 9A, the spacers 902(1), 902(2) are also formed on sides on adjacent to opposing sides of the first mandrel 722G that will provide masks over regions of the GAA channel material structure 714 will eventually form the GAA channel structure 402G. The formation of the spacers 902(1), 902(2) allow the formation of the GAA channel structure 402G in a manner that may not be achievable with conventional lithography. Then, as shown in the fabrication stage 900(B) in FIG. 9B, an optional trim (e.g., an etch) of the spacers 726(1), 726(2) is performed to form spacers 726(1)', 726(2)' to control the eventual width of fins in the formed fin channel structure 402F. The fin channel structure 402F will be formed from the second substrate 304(2) and also possible the first substrate 304(1) that is located beneath the spacers 726(1)', 726(2)'. A hard mask layer 728 is disposed above the first mandrel 722G and the spacers 902(1), 902(2) to protect the spacers 902(1), 902(2) from being trimmed.

Figure 9B:
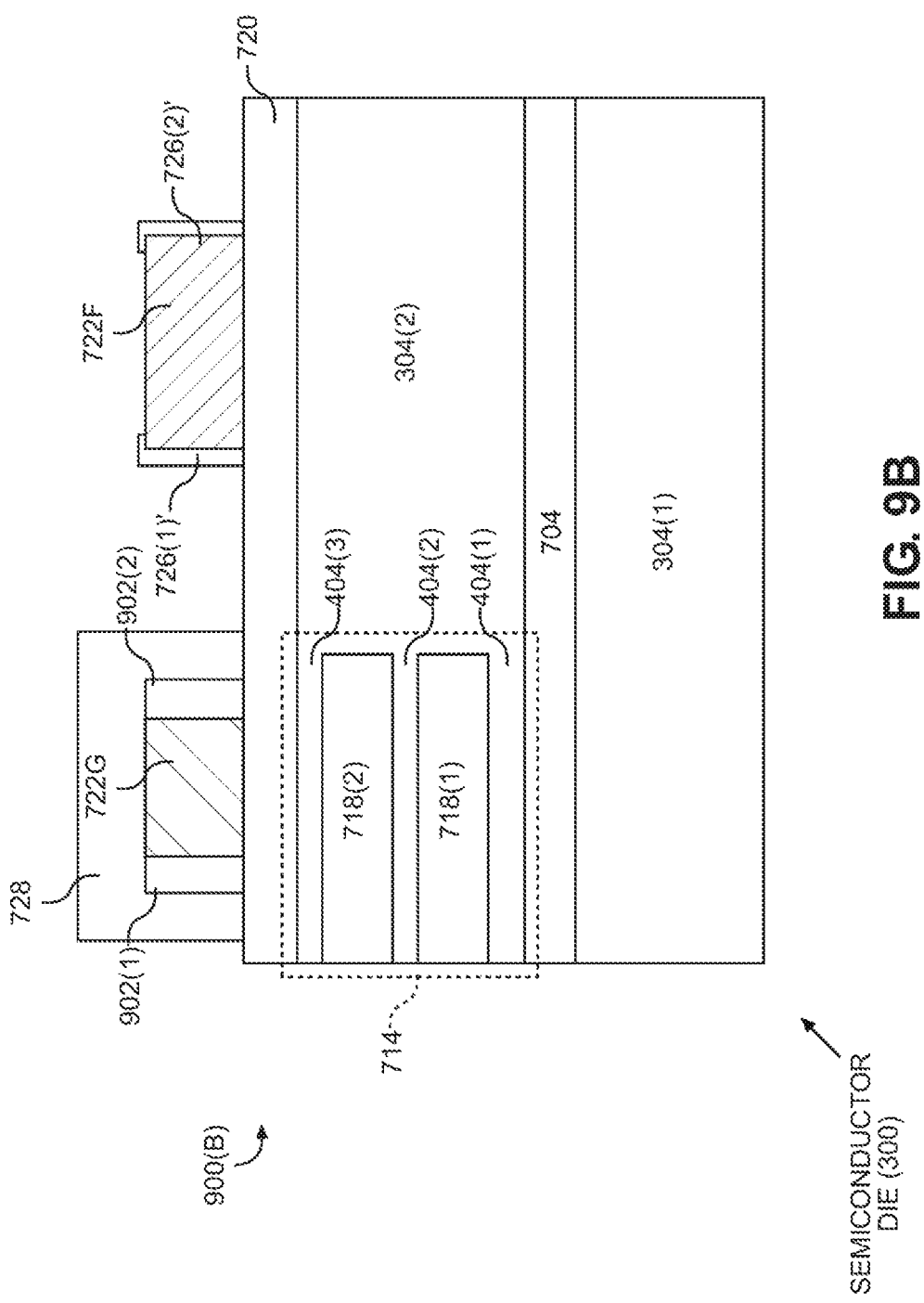
FIG. 9B illustrates a side view of another exemplary fabrication stage to the fabrication stage in FIG. 9A of forming a hard mask over the spacers and mandrel above the GAA channel structure in the fabrication stage of the semiconductor die in FIG. 9A, as part of a process of fabricating a channel structure for a GAA FET integrated with a FinFET on a common substrate of a semiconductor die.
Figure 9C:
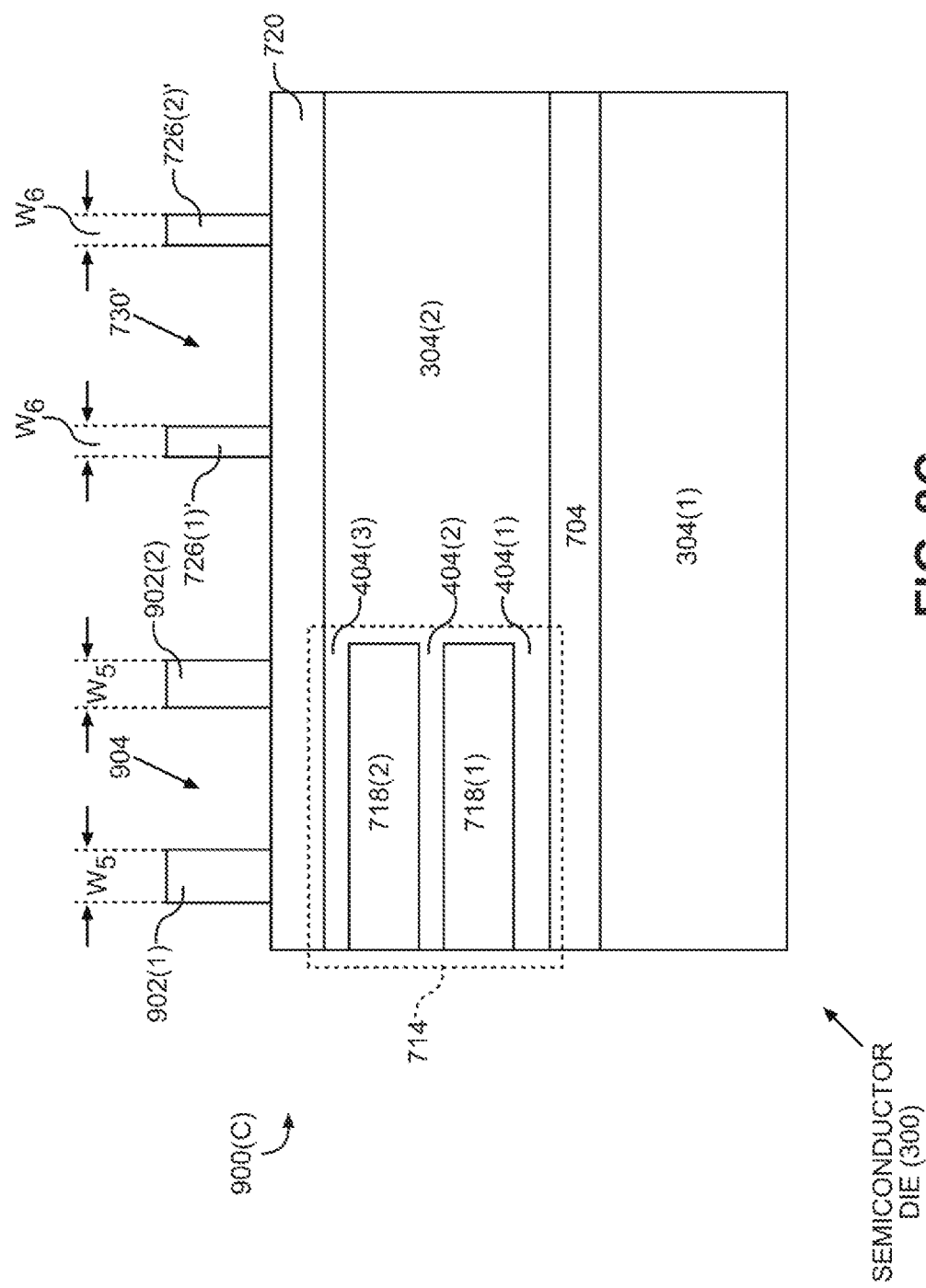
FIG. 9C illustrates a side view of another exemplary fabrication stage to the fabrication stage in FIG. 9A of removing the hard mask layer and mandrel in the fabrication stage of the semiconductor die in FIG. 9B, as part of a process of fabricating a channel structure for a GAA FET integrated with a FinFET on a common substrate of a semiconductor die.
Figure 9D:
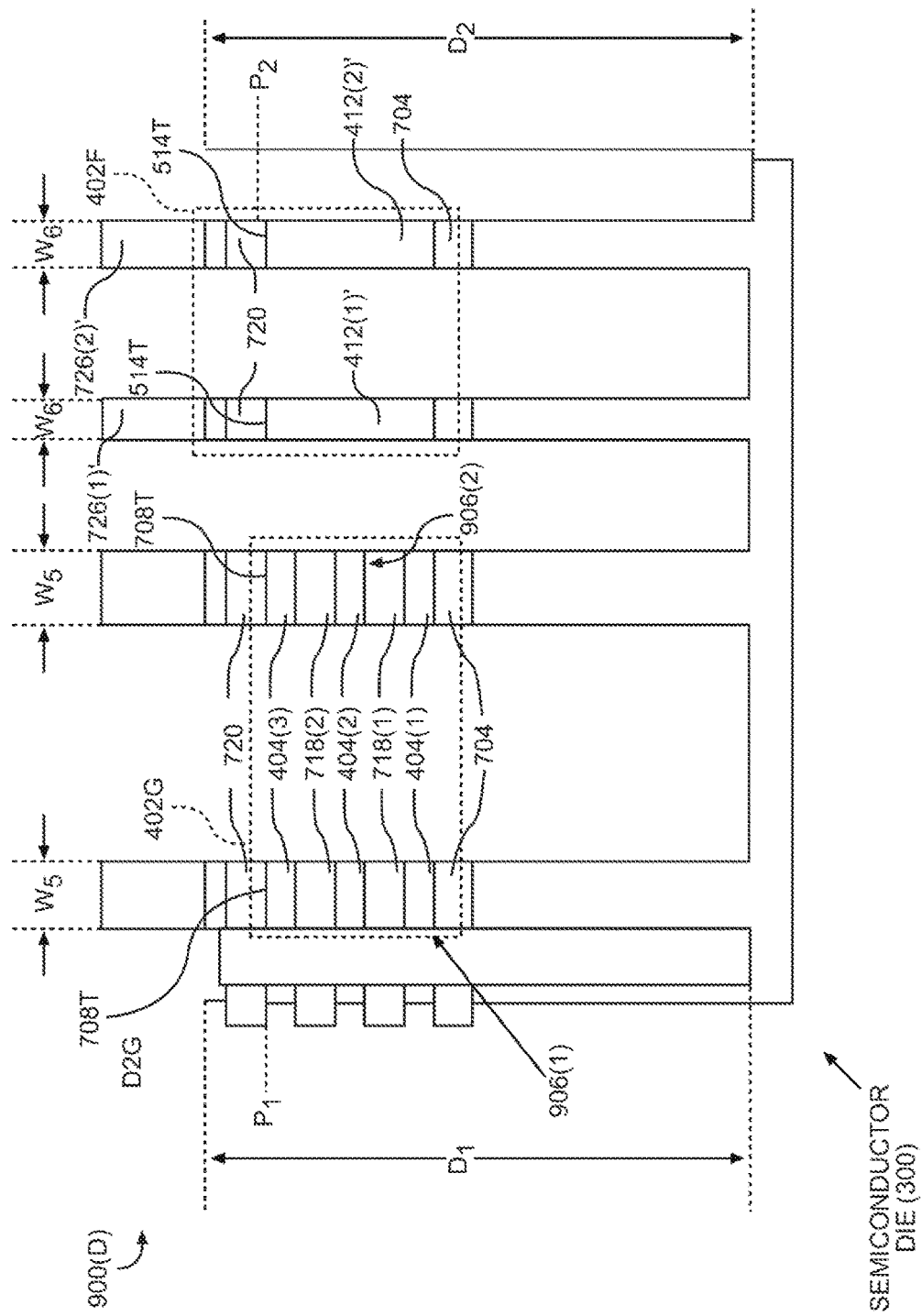
FIG. 9D illustrates a side view of another exemplary fabrication stage after etching in the openings between the spacers into the GAA channel structure and the FinFET channel structure, as part of a process of fabricating a FinFET and a GAA FET integrated on a common substrate of a semiconductor die.

FIG. 9C illustrates a side view of another exemplary fabrication stage 900(C) to the fabrication stage 900(B) in FIG. 9B of removing the hard mask layer 728 and the mandrels 722G, 722F to prepare for etching. Openings 904, 730' are provided between the spacers 902(1), 902(2) and the spacers 726(1)', 726(2)' where the mandrels 722G, 722F were previously formed. FIG. 9D illustrates a side view of another fabrication stage 900(D) wherein the fin channel material 706 below the first and second portions 732, 712 of the second substrate 304(2) is removed to form the fin channel structure 402F and the GAA channel structure 402G. As shown therein, the GAA channel material structure 714 in the second portion 712 of the second substrate 304(2) and the first substrate 304(1) below the second portion 712 of the second substrate 304(2) outside of the recess 710 is removed (e.g., etched) to a first depth $D_1$ to form the GAA channel structure 402G. In this example, the spacers 902(1), 902(2) form hard masks such that two GAA channels 906(1), 906(2) of width $W_5$ are formed in the GAA channel structure 402G. As also shown in FIG. 9D, the fin channel material 706 in the first portion 732 of the second substrate 304(2) and the first substrate 304(1) below the first portion of the second substrate 304(2) is removed (e.g., etched) to a second depth $D_2$ to form the fin channel structure 402F from the second substrate 304(2) thereby forming two (2) fins 412(1)', 412(2)' each of width $W_6$, which is controlled by the width of the trimmed spacers 726(1)', 726(2)'. In this manner, the spacers 902(1), 902(2) and the trimmed spacers 726(1)', 726(2)' form a hard mask, and may be of the same material type for process convenience.

Figure 9E:
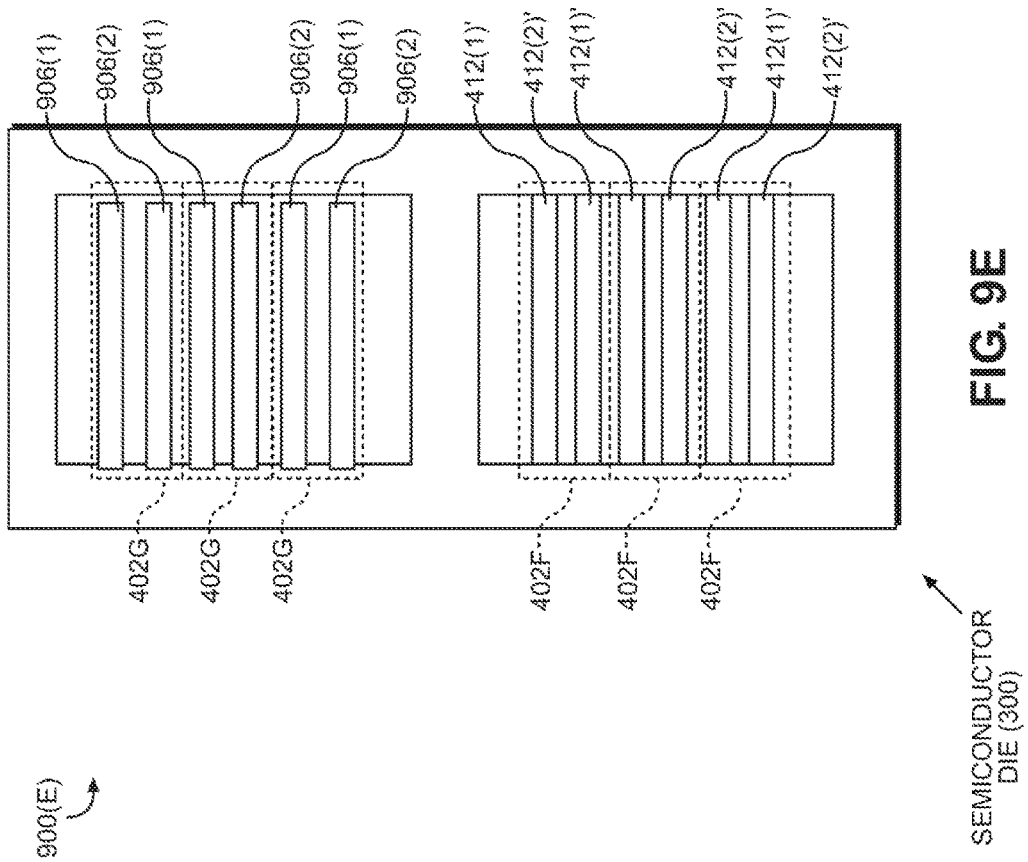
FIG. 9E is a top view of an exemplary final fabrication stage of a fabricated GAA FET and FinFET integrated on a common substrate of a semiconductor die as part of the process of fabricating a channel structure for a GAA FET integrated with a FinFET on a common substrate of a semiconductor die in FIGS. 7A-7E-2 and 9A-9D.

FIG. 9E illustrates an additional fabrication stage 900(E) where a top down view of the semiconductor die 300 is shown. The fabrication stage 900(E) may be provided after the fabrication stages 700(J)-700(L-3) in FIGS. 7J-7L-3 are performed as an example. The GAA FETs 400G and FinFETs 400F, and their respective GAA channel structures 402G and fin channel structures 402F are shown. Each of the GAA channel structures 402G and fin channel structures 402F includes respective GAA channels 906(1), 906(2) and the fins 412(1)', 412(2)'. Note that the etch stop layer 704 may be diffused into the first substrate 304(1) during further annealing processing steps.

ICs that include a GAA FET(s) and a FinFET(s) integrated on a common substrate of a semiconductor die, including but not limited to, the semiconductor die 300 in FIG. 5, the semiconductor die 300 in FIG. 7M fabricated according to the process in FIGS. 7A-7L-3, the semiconductor die 300 in FIG. 8F fabricated according to the process in FIGS. 7A-7D-2 and 8A-8E, and the semiconductor die 300 in FIG. 9M fabricated according to the process in FIGS. 7A-7E-2 and 9A-9D, and according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
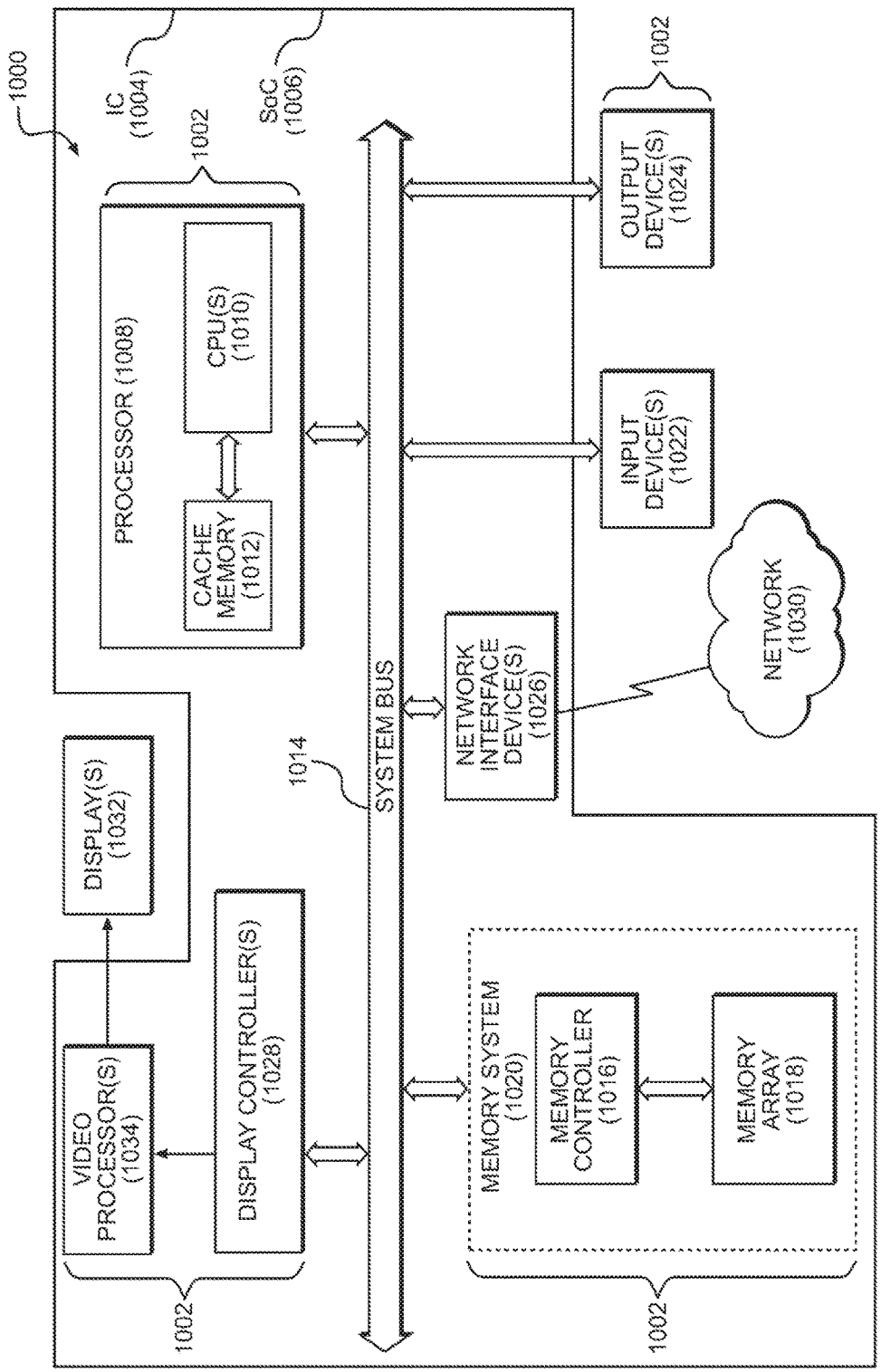
FIG. 10 is a block diagram of an exemplary processor-based system that can include ICs that include a GAA FET(s) and FinFET(s) integrated on a common substrate of a semiconductor die, including, but not limited to the semiconductor die in FIG. 5, the semiconductor die in FIG. 7M fabricated according to the process in FIGS. 7A-7L-3, the semiconductor die in FIG. 8F fabricated according to the process in FIGS. 7A-7D-2 and 8A-8E, and the semiconductor die in FIG. 9M fabricated according to the process in FIGS. 7A-7E-2 and 9A-9D.

In this regard, FIG. 10 illustrates an example of a processor-based system 1000 that can include ICs 1002 that include a GAA FET(s) and a FinFET(s) integrated on a common substrate of a semiconductor die, including but not limited to the semiconductor die 300 in FIG. 5, the semiconductor die 300 in FIG. 7M fabricated according to the process in FIGS. 7A-7L-3, the semiconductor die 300 in FIG. 8F fabricated according to the process in FIGS. 7A-7D-2 and 8A-8E, and the semiconductor die 300 in FIG. 9M fabricated according to the process in FIGS. 7A-7E-2 and 9A-9D, and according to any aspects disclosed herein. In this example, the processor-based system 1000 may be formed as an IC 1004 in a system-on-a-chip (SoC) 1006. The processor-based system 1000 includes a processor 1008 that includes one or more central processor units (CPUs) 1010, which may also be referred to as CPU or processor cores. The processor 1008 may have cache memory 1012 coupled to the processor(s) 1008 for rapid access to temporarily stored data. As an example, the cache memory 1012 could include ICs 1002 that include a GAA FET(s) and a FinFET(s) integrated on a common substrate of a semiconductor die, including but not limited to the semiconductor die 300 in FIG. 5, the semiconductor die 300 in FIG. 7M fabricated according to the process in FIGS. 7A-7L-3, the semiconductor die 300 in FIG. 8F fabricated according to the process in FIGS. 7A-7D-2 and 8A-8E, and the semiconductor die 300 in FIG. 9M fabricated according to the process in FIGS. 7A-7E-2 and 9A-9D, and according to any aspects disclosed herein. The processor 1008 is coupled to a system bus 1014 and can intercouple master and slave devices included in the processor-based system 1000. As is well known, the processor 1008 communicates with these other devices by exchanging address, control, and data information over the system bus 1014. For example, the processor 1008 can communicate bus transaction requests to a memory controller 1016 as an example of a slave device. Although not illustrated in FIG. 10, multiple system buses 1014 could be provided, wherein each system bus 1014 constitutes a different fabric.

Other master and slave devices can be connected to the system bus 1014. As illustrated in FIG. 10, these devices can include a memory system 1020 that includes the memory controller 1016 and a memory array(s) 1018, one or more input devices 1022, one or more output devices 1024, one or more network interface devices 1026, and one or more display controllers 1028, as examples. Each of the memory system 1020, the one or more input devices 1022, the one or more output devices 1024, the one or more network interface devices 1026, and the one or more display controllers 1028 can include ICs 1002 that include a GAA FET(s) and a FinFET(s) integrated on a common substrate of a semiconductor die, including but not limited to the semiconductor die 300 in FIG. 5, the semiconductor die 300 in FIG. 7M fabricated according to the process in FIGS. 7A-7L-3, the semiconductor die 300 in FIG. 8F fabricated according to the process in FIGS. 7A-7D-2 and 8A-8E, and the semiconductor die 300 in FIG. 9M fabricated according to the process in FIGS. 7A-7E-2 and 9A-9D, and according to any aspects disclosed herein. The input device(s) 1022 can include any type of input device, including, but not limited to, input keys, switches, voice processors, etc. The output device(s) 1024 can include any type of output device, including, but not limited to, audio, video, other visual indicators, etc. The network interface device(s) 1026 can be any device configured to allow exchange of data to and from a network 1030. The network 1030 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1026 can be configured to support any type of communications protocol desired.

The processor 1008 may also be configured to access the display controller(s) 1028 over the system bus 1014 to control information sent to one or more displays 1032. The display controller(s) 1028 sends information to the display(s) 1032 to be displayed via one or more video processors 1034, which process the information to be displayed into a format suitable for the display(s) 1032. The display(s) 1032 can include any type of display, including, but not limited to, a cathode ray tube (CRT), a liquid crystal display (LCD), a plasma display, a light emitting diode (LED) display, etc. The display controller(s) 1028, the display(s) 1032, and/or the video processor(s) 1034 can include ICs 1002 that include a GAA FET(s) and a FinFET(s) integrated on a common substrate of a semiconductor die, including but not limited to the semiconductor die 300 in FIG. 5, the semiconductor die 300 in FIG. 7M fabricated according to the process in FIGS. 7A-7L-3, the semiconductor die 300 in FIG. 8F fabricated according to the process in FIGS. 7A-7D-2 and 8A-8E, and the semiconductor die 300 in FIG. 9M fabricated according to the process in FIGS. 7A-7E-2 and 9A-9D, and according to any aspects disclosed herein.

Figure 11:
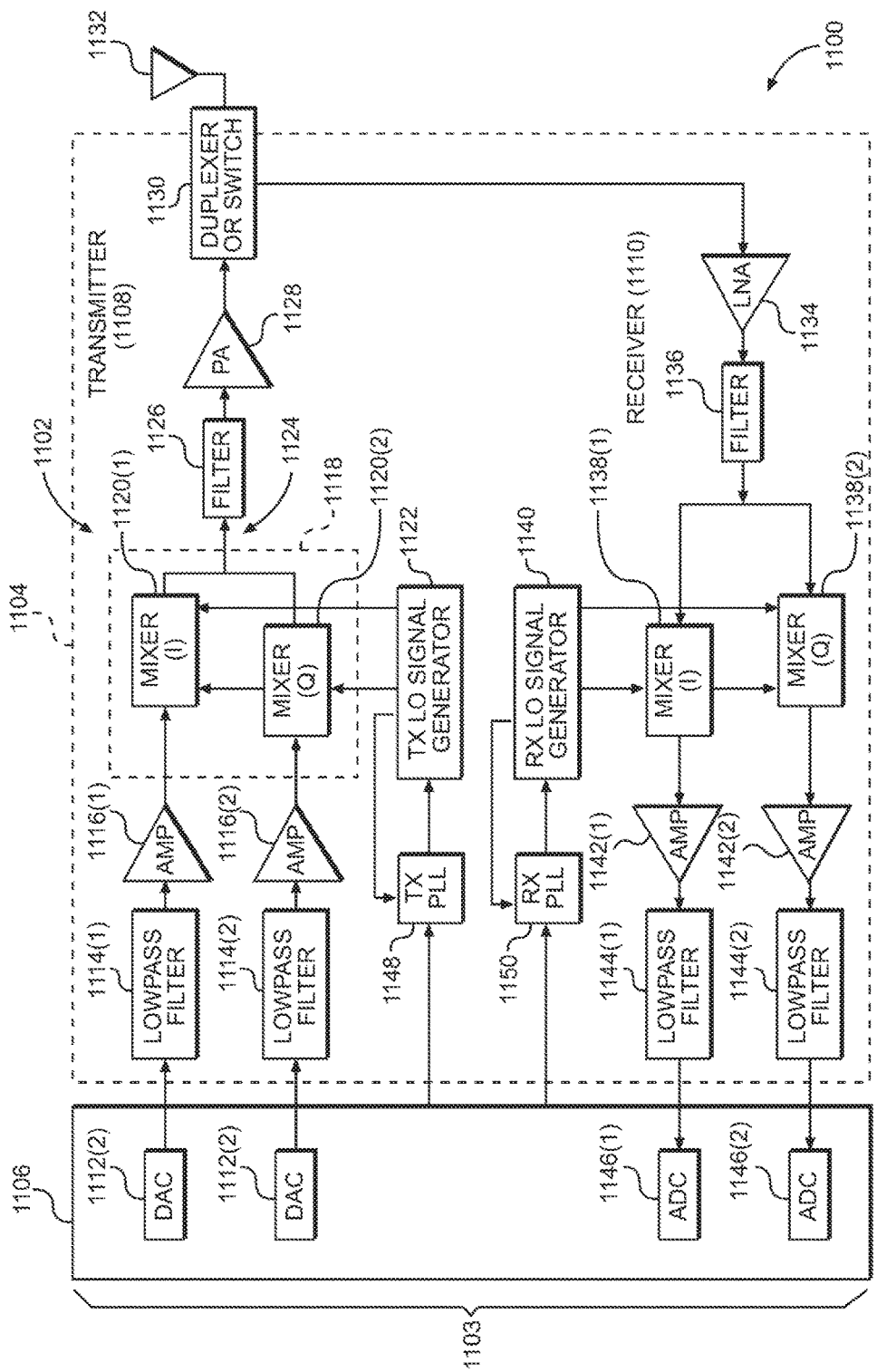
FIG. 11 is a block diagram of an exemplary wireless communications device that includes radio frequency (RF) components formed from an IC, wherein any of the components therein can include ICs that include a GAA FET(s) and FinFET(s) integrated on a common substrate of a semiconductor die, including, but not limited to the semiconductor die in FIG. 5, the IC in FIG. 7M fabricated according to the process in FIGS. 7A-7L-3, the semiconductor die in FIG. 8F fabricated according to the process in FIGS. 7A-7D-2 and 8A-8E, and the semiconductor die in FIG. 9M fabricated according to the process in FIGS. 7A-7E-2 and 9A-9D.

FIG. 11 illustrates an exemplary wireless communications device 1100 that includes radio frequency (RF) components formed from an IC 1102, wherein any of the components therein can include ICs 1102 that include a GAA FET(s) and a FinFET(s) integrated on a common substrate of a semiconductor die, including but not limited to the semiconductor die 300 in FIG. 5, the semiconductor die 300 in FIG. 7M fabricated according to the process in FIGS. 7A-7L-3, the semiconductor die 300 in FIG. 8F fabricated according to the process in FIGS. 7A-7D-2 and 8A-8E, and the semiconductor die 300 in FIG. 9M fabricated according to the process in FIGS. 7A-7E-2 and 9A-9D, and according to any aspects disclosed herein. The wireless communications device 1100 may include or be provided in any of the above-referenced devices, as examples. As shown in FIG. 11, the wireless communications device 1100 includes a transceiver 1104 and a data processor 1106. The data processor 1106 may include a memory to store data and program codes. The transceiver 1104 includes a transmitter 1108 and a receiver 1110 that support bi-directional communications. In general, the wireless communications device 1100 may include any number of transmitters 1108 and/or receivers 1110 for any number of communication systems and frequency bands. All or a portion of the transceiver 1104 may be implemented on one or more analog ICs, RF ICs (RFICs), mixed-signal ICs, etc.

The transmitter 1108 or the receiver 1110 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1110. In the direct-conversion architecture, a signal is frequency-converted between RF and baseband in one stage. The super-heterodyne and direct-conversion architectures may use different circuit blocks and/or have different requirements. In the wireless communications device 1100 in FIG. 11, the transmitter 1108 and the receiver 1110 are implemented with the direct-conversion architecture.

In the transmit path, the data processor 1106 processes data to be transmitted and provides I and Q analog output signals to the transmitter 1108. In the exemplary wireless communications device 1100, the data processor 1106 includes digital-to-analog converters (DACs) 1112(1), 1112(2) for converting digital signals generated by the data processor 1106 into the I and Q analog output signals, e.g., I and Q output currents, for further processing.

Within the transmitter 1108, lowpass filters 1114(1), 1114(2) filter the I and Q analog output signals, respectively, to remove undesired signals caused by the prior digital-to-analog conversion. Amplifiers (AMPs) 1116(1), 1116(2) amplify the signals from the lowpass filters 1114(1), 1114(2), respectively, and provide I and Q baseband signals. An upconverter 1118 upconverts the I and Q baseband signals with I and Q transmit (TX) local oscillator (LO) signals through mixers 1120(1), 1120(2) from a TX LO signal generator 1122 to provide an upconverted signal 1124. A filter 1126 filters the upconverted signal 1124 to remove undesired signals caused by the frequency upconversion as well as noise in a receive frequency band. A power amplifier (PA) 1128 amplifies the upconverted signal 1124 from the filter 1126 to obtain the desired output power level and provides a transmitted RF signal. The transmitted RF signal is routed through a duplexer or switch 1130 and transmitted via an antenna 1132.

In the receive path, the antenna 1132 receives signals transmitted by base stations and provides a received RF signal, which is routed through the duplexer or switch 1130 and provided to a low noise amplifier (LNA) 1134. The duplexer or switch 1130 is designed to operate with a specific receive (RX)-to-TX duplexer frequency separation, such that RX signals are isolated from TX signals. The received RF signal is amplified by the LNA 1134 and filtered by a filter 1136 to obtain a desired RF input signal. Down-conversion mixers 1138(1), 1138(2) mix the output of the filter 1136 with I and Q RX LO signals (i.e., LO_I and LO_Q) from an RX LO signal generator 1140 to generate I and Q baseband signals. The I and Q baseband signals are amplified by amplifiers (AMPs) 1142(1), 1142(2) and further filtered by lowpass filters 1144(1), 1144(2) to obtain I and Q analog input signals, which are provided to the data processor 1106. In this example, the data processor 1106 includes analog-to-digital converters (ADCs) 1146(1), 1146(2) for converting the analog input signals into digital signals to be further processed by the data processor 1106.

In the wireless communications device 1100 of FIG. 11, the TX LO signal generator 1122 generates the I and Q TX LO signals used for frequency upconversion, while the RX LO signal generator 1140 generates the I and Q RX LO signals used for frequency downconversion. Each LO signal is a periodic signal with a particular fundamental frequency. A TX phase-locked loop (PLL) circuit 1148 receives timing information from the data processor 1106 and generates a control signal used to adjust the frequency and/or phase of the TX LO signals from the TX LO signal generator 1122. Similarly, an RX PLL circuit 1150 receives timing information from the data processor 1106 and generates a control signal used to adjust the frequency and/or phase of the RX LO signals from the RX LO signal generator 1140.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A semiconductor die, comprising:
   a substrate comprising a semiconductor material, the substrate comprising a top surface and a bottom surface;
   one or more gate-all-around (GAA) field-effect transistors (FETs) each comprising:
      a GAA channel structure disposed on the substrate, comprising:
         a plurality of nanostructures each comprising the semiconductor material and formed in a stacked arrangement on the substrate; and
         a plurality of separation areas disposed between adjacent nanostructures among the plurality of nanostructures;
         the GAA channel structure having a top surface disposed in a first plane above the top surface of the substrate; and
      a first gate material disposed in at least a portion of the plurality of separation areas between the adjacent nanostructures; and
   one or more FinFETs each comprising:
      at least one fin channel structure comprising the semiconductor material and disposed on the substrate; and
      a second gate material disposed adjacent to at least a portion of a top surface and a side of the at least one fin channel structure;
      the top surface of the at least one fin channel structure disposed in the first plane.

2. The semiconductor die of claim 1, wherein:
   the GAA channel structure comprises a bottom surface disposed in contact with the top surface of the substrate in a third plane; and
   the at least one fin channel structure comprises a bottom surface disposed in contact with the top surface of the substrate in a fourth plane different from the third plane.

3. The semiconductor die of claim 1, wherein:
   the GAA channel structure comprises a bottom surface disposed in contact with the top surface of the substrate in a third plane; and
   the at least one fin channel structure comprises a bottom surface disposed in contact with the top surface of the substrate in the third plane.

4. The semiconductor die of claim 1, further comprising:
   a first shallow trench isolation (STI) layer disposed on the substrate and comprising a first STI top surface disposed in a third plane at a third height above the top surface of the substrate, the first STI layer further disposed adjacent to at least a portion of the GAA channel structure; and
   a second STI layer disposed on the substrate and comprising a second STI top surface disposed in a fourth plane at a fourth height above the top surface of the substrate, the second STI layer further disposed adjacent to at least a portion of the at least one fin channel structure.

5. The semiconductor die of claim 4, wherein:
   the fourth plane is the same as the third plane;
   the top surface of the GAA channel structure is disposed above the first STI top surface at a first height; and
   the top surface of the at least one fin channel structure is disposed above the second STI top surface at the first height.

6. The semiconductor die of claim 4, wherein:
   the fourth plane is different from the third plane;
   the top surface of the GAA channel structure is disposed above the first STI top surface at a first height; and
   the top surface of the at least one fin channel structure is disposed above the second STI top surface at a second height different from the first height.

7. The semiconductor die of claim 1, wherein the plurality of nanostructures comprises a top nanostructure having a top surface disposed in the first plane above the top surface of the substrate.

8. The semiconductor die of claim 7, wherein:
   the top nanowire structure has a first height in a direction orthogonal to the first plane; and
   the other nanostructures among the plurality of nanostructures each have a height in the direction orthogonal to the first plane different from the first height.

9. The semiconductor die of claim 1, wherein:
   the one or more GAA FETs comprise a plurality of GAA FETs disposed adjacent to each other on the substrate with a first pitch; and
   the one or more FinFETs comprise a plurality of FinFETs disposed adjacent to each other on the substrate with a second pitch.

10. The semiconductor die of claim 9, wherein the first pitch is greater than the second pitch.

11. The semiconductor die of claim 1, wherein:
    the GAA channel structure has a first width between approximately 12-30 nanometers (nm); and the at least one fin channel structure each has a second width between approximately 5-10 nm.

12. The semiconductor die of claim 1, wherein the semiconductor material of the substrate comprises Silicon (Si).

13. The semiconductor die of claim 1, further comprising:
    a processing unit (PU) comprising at least one of the one or more FinFETs; and
    a memory array comprising at least one of the one of more GAA FETs.

14. The semiconductor die of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

15. A method of fabricating one or more Fin field-effect transistors (FETs) FinFETs and one or more gate-all-around (GAA) FETs integrated on a common substrate of a semiconductor die, comprising:
    forming a first substrate disposed in a first longitudinal axis and comprising a semiconductor material;
    forming an etch stop layer on the first substrate;
    forming a second substrate disposed in a second longitudinal axis parallel to the first longitudinal axis and comprising the semiconductor material on the etch stop layer, the second substrate comprising a top surface and a bottom surface, wherein a first portion of the second substrate comprises a fin channel material;
    selectively forming one or more recesses in a second portion of the second substrate from the top surface of the second substrate to the etch stop layer in a first direction orthogonal to the second longitudinal axis;
    forming a GAA channel material structure in each recess among the one or more recesses;
    removing the GAA channel material structure in the second portion of the second substrate and the first substrate below the second portion of the second substrate outside of the one or more recesses to form one or more GAA channel structures having a first top surface disposed in a first plane above a top surface of the first substrate; and
    removing the fin channel material in the first portion of the second substrate and the first substrate below the first portion of the second substrate to form one or more fin channel structures from the second substrate, the one or more fin channel structures having a second top surface disposed in the first plane.

16. The method of claim 15, further comprising disposing a shallow trench isolation (STI) layer on the first substrate between the one or more GAA channel structures and the one or more fin channel structures.

17. The method of claim 15, further comprising planarizing the first top surface of the one or more GAA channel structures and the second top surface of the one or more fin channel structures to the first plane.

* * * * *